(12) United States Patent
Shin

(10) Patent No.: US 12,166,020 B2
(45) Date of Patent: Dec. 10, 2024

(54) DISPLAY APPARATUS HAVING DISPLAY MODULE AND METHOD OF MANUFACTURING THE SAME

(71) Applicant: SAMSUNG ELECTRONICS CO., LTD., Suwon-si (KR)

(72) Inventor: Seonghwan Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 354 days.

(21) Appl. No.: 17/533,896

(22) Filed: Nov. 23, 2021

(65) Prior Publication Data

US 2022/0084994 A1  Mar. 17, 2022

Related U.S. Application Data

(63) Continuation of application No. PCT/KR2021/004759, filed on Apr. 15, 2021.

(30) Foreign Application Priority Data

May 15, 2020  (KR) .......................... 10-2020-0058422

(51) Int. Cl.
*H01L 25/13* (2006.01)
*H01L 25/075* (2006.01)
(Continued)

(52) U.S. Cl.
CPC .......... *H01L 25/13* (2013.01); *H01L 25/0753* (2013.01); *H01L 33/005* (2013.01);
(Continued)

(58) Field of Classification Search
CPC ... H01L 25/13; H01L 25/0753; H01L 25/167; H01L 33/005; H01L 33/483; H01L 33/58;
(Continued)

(56) References Cited

U.S. PATENT DOCUMENTS 9,332,665 B2  5/2016  Hwang et al.
11,934,058 B2  3/2024  Jeong et al.
(Continued)

FOREIGN PATENT DOCUMENTS

CN  110600459 A  12/2019
EP  3 343 274 A2  7/2018
(Continued)

OTHER PUBLICATIONS

Communication dated Oct. 9, 2023, issued by the European Patent Office in counterpart European Application No. 21805031.8.
(Continued)

*Primary Examiner* — Anne M Hines
*Assistant Examiner* — Jose M Diaz
(74) *Attorney, Agent, or Firm* — Sughrue Mion, PLLC

(57) ABSTRACT

A display module includes a substrate including a mounting surface on which a plurality of inorganic LEDs are mounted and a side surface orthogonal to the mounting surface; a cover which is disposed on the mounting surface, and is configured to cover the mounting surface and extend to an area outside the mounting surface; and a side surface member provided on the side surface, and configured to be bonded to a lower surface of a region of the cover that corresponds to the area outside the mounting surface and to at least a part of the side surface.

23 Claims, 14 Drawing Sheets

(51) Int. Cl.
  *H01L 33/00* (2010.01)
  *H01L 33/48* (2010.01)
  *H01L 33/58* (2010.01)
  *H01L 33/62* (2010.01)
(52) U.S. Cl.
  CPC ............ *H01L 33/483* (2013.01); *H01L 33/58* (2013.01); *H01L 33/62* (2013.01)
(58) Field of Classification Search
  CPC ..... H01L 33/62; G02F 1/1333; G02F 1/1336; G02F 1/133603
  See application file for complete search history.

(56) References Cited

U.S. PATENT DOCUMENTS

| | | | |
|---|---|---|---|
| 2017/0194600 A1 | 7/2017 | Yu et al. | |
| 2019/0122592 A1* | 4/2019 | Han | G09F 9/3026 |
| 2020/0066694 A1 | 2/2020 | Min et al. | |
| 2021/0343907 A1 | 11/2021 | Fan et al. | |

FOREIGN PATENT DOCUMENTS

| | | |
|---|---|---|
| EP | 3 547 366 A1 | 10/2019 |
| JP | 2002-297065 A | 10/2002 |
| KR | 10-2007-0096213 A | 10/2007 |
| KR | 10-0851470 B1 | 8/2008 |
| KR | 10-2014-0009953 A | 1/2014 |
| KR | 10-2017-0050707 A | 5/2017 |
| KR | 10-2018-0079080 A | 7/2018 |
| KR | 10-2019-0003208 A | 1/2019 |
| KR | 10-2019-0046684 A | 5/2019 |
| KR | 10-2020-0004174 A | 1/2020 |
| KR | 10-2020-0051929 A | 5/2020 |
| KR | 10-2021-0083875 A | 7/2021 |
| WO | 2019/097583 A1 | 5/2019 |

OTHER PUBLICATIONS

Written Opinion (PCT/ISA/237) issued by the International Searching Authority in International Application No. PCT/KR2021/004759, issued on Jul. 22, 2021.

International Search Report (PCT/ISA/210) issued by the International Searching Authority in International Application No. PCT/KR2021/004759, issued on Jul. 22, 2021.

Office Action issued Aug. 22, 2024 by the Korean Patent Office for KR Patent Application No. 10-2020-0058422.

* cited by examiner

DISPLAY APPARATUS HAVING DISPLAY MODULE AND METHOD OF MANUFACTURING THE SAME

CROSS-REFERENCE TO RELATED APPLICATION(S)

This application is Continuation of International Application No. PCT/KR2021/004759, filed on Apr. 15, 2021, which claims priority under 35 U.S.C. § 119 to Korean Patent Application No. 10-2020-0058422, filed on May 15, 2020, in the Korean Intellectual Property Office, the disclosures of which are incorporated by reference herein in their entireties.

BACKGROUND

1. Field

The disclosure relates to a display apparatus for displaying an image by coupling modules each having self-emissive inorganic light emitting diodes (LEDs) mounted on a substrate.

2. Description of Related Art

A display apparatus is a type of an output device that visually displays data information, such as characters and figures, images, and the like.

In general, for a display apparatus, a liquid crystal panel requiring a backlight, or an organic LED (OLED) panel formed of an organic compound film that emits light by itself in response to an electric current have been mainly used. However, the liquid crystal panel has a slow response time and large power consumption, and requires a backlight due to limitation on emitting light by itself, having a difficulty in providing the display apparatus in a compact size. In contrast, the OLED panel does not require a backlight due to emitting light by itself, and thus achieves slim thickness, but the OLED panel is susceptible to a burn-in phenomenon in which when the same screen is displayed for a long time, a part of the screen remains even when the screen is switched due to the life of sub-pixels being ended.

Accordingly, in order to find a replacement for the LCD panel and the OLED panel, research has been conducted on an LED panel that mounts an inorganic LED on a substrate and uses the inorganic LED itself as a pixel.

Such an LED panel is a self-emissive device but is not susceptible to OLED burn-in as an inorganic light-emitting diode, and has excellent brightness, resolution, power consumption, and durability.

In addition, the micro-LEDs may achieve a substrate-level display modulation by arranging LEDs on a circuit board in units of pixels, and provide various resolutions and screen sizes of display according to the customer's order.

SUMMARY

Provided are a display apparatus and a method of manufacturing the same, and specifically, a display module suitable for a large sized display, a display apparatus having the same, and a method of manufacturing the same.

Additional aspects will be set forth in part in the description which follows and, in part, will be apparent from the description, or may be learned by practice of the presented embodiments.

In accordance with an aspect of the disclosure, there is provided a display module including: a substrate including a mounting surface on which a plurality of inorganic LEDs are mounted and a side surface; a cover bonded to the mounting surface and configured to cover the mounting surface; and a side surface member provided on the side surface and arranged below the cover in a direction in which the mounting surface faces. The cover is arranged farther outward than the mounting surface in a direction in which the mounting surface extends, and the side surface member is provided to be bonded to a lower surface of a region of the cover that extends farther outward than the mounting surface and at least a part of the side surface.

The side surface member may include a material that absorbs light.

The side surface member may be provided to support the lower surface of the region of the cover that extends farther outward than the mounting surface and the at least a part of the side surface.

One end of the cover in the direction in which the mounting surface extends and one end of the side surface member in the direction in which the mounting surface extends may be arranged on a same line in the direction in which the mounting surface faces.

The substrate may further include a chamfered portion formed between the mounting surface and the side surface, and the side surface member may be provided to surround an entire area of the chamfered portion.

The side surface may be provided to correspond to four edges of the mounting surface, the cover may be provided to extend farther outward than the four edges of the mounting surface in the direction in which the mounting surface extends, and the side surface member may surround the side surfaces and the lower surface of the region of the cover that extends farther outward than the mounting surface along circumferences of the four edges of the mounting surface.

The cover may include an adhesive layer forming the lower surface of the cover in the direction in which the mounting surface faces, and the side surface member may cover a region of the adhesive layer that extends farther outward than the mounting surface.

The cover may further include a layer arranged in front of the adhesive layer in the direction in which the mounting surface faces, the layer including a material provided to reduce light transmittance.

The cover may include a first region arranged outside the mounting surface in the direction in which the mounting surface extends, and a second region arranged on the mounting surface, and the side surface member may be provided only at a position corresponding to the second region in the direction the mounting surface faces.

The substrate may further include a rear surface that is disposed to be opposite to the mounting surface, a first chamfered portion formed between the mounting surface and the side surface, and a second chamfered portion formed between the side surface and the rear surface, and the side surface member may be provided to surround the first chamber portion and the second chamber portion.

The substrate may further include a metal plate that faces the rear surface of the substrate, and the side surface member may be provided to extend from an edge of the mounting surface to an edge of the metal plate disposed in the same direction as the edge of the mounting surface.

The side surface member may include a photosensitive material.

The side surface member may be provided to have a darker color than the cover.

In accordance with an aspect of the disclosure, there is provided a display apparatus including a display module array in which a plurality of display modules are horizontally arranged in a matrix of M×N, each of the plurality of display modules including: a substrate including a mounting surface on which a plurality of inorganic LEDs are mounted and a side surface; a cover bonded to the mounting surface and configured to cover the mounting surface; and a side surface member provided on the side surface and arranged below the cover in a direction in which the mounting surface faces. The cover is arranged farther outward than the mounting surface in a direction in which the mounting surface extends, and the side surface member is provided to be bonded to a lower surface of a region of the cover that extends farther outward than the mounting surface and at least a part of the side surface.

The plurality of display modules may include a first display module and a second display module arranged adjacent to the first display module, one end of the cover of the first display module in a direction adjacent to the second display module and the side surface member provided at a side surface of the first display module in the direction adjacent to the second display module may be arranged in a gap formed between the mounting surface of the first display module and the mounting surface of the second display module.

One end of the cover of the second display module adjacent to the one end of the first display module and the side surface member of the second display module adjacent to the side surface member of the first display module may be arranged in the gap formed between the mounting surface of the first display module and the mounting surface of the second display module.

A side end portion of a side cover of the first display module in the direction in which the mounting surface extends, and a side end portion of a side cover of the second display module adjacent to the side end portion of the side cover of the first display module may be arranged to face each other.

The side end portion of the side cover of the second display module adjacent to the side end portion of the side cover of the first display module may be disposed substantially parallel to each other.

The side surface member may include a material that absorbs light.

The side surface member may be provided to support a lower surface of a region of the cover that extends farther outward than the mounting surface and at least a portion of the side surface.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

The embodiments set forth herein are not representative of the full the technical spirit of the disclosure, so it should be understood that they may be replaced with various equivalents and modifications.

In the following description, it is to be understood that the singular forms "a," "an," and "the" include plural references unless the context clearly dictates otherwise. In order to make the description of the disclosure clear, unrelated parts are not shown and, the sizes of components are exaggerated for clarity.

It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

In addition, the meaning of "identical" in the specification may refers to "substantially identical". It should be understood that the meaning of "substantially identical" refers to a value that falls within an error range in manufacturing or a value having a difference within a range that does not have a significance with respect to a reference value.

As used herein, the terms such as "1st" or "first," "2nd" or "second," etc., may modify corresponding components regardless of importance or order and are used to distinguish one component from another without limiting the components. For example, a first component may be referred to as a second component, and similarly, a second component may also be referred to as a first component.

Hereinafter, certain embodiments will be described in detail with reference to the accompanying drawings.

Figure 1:
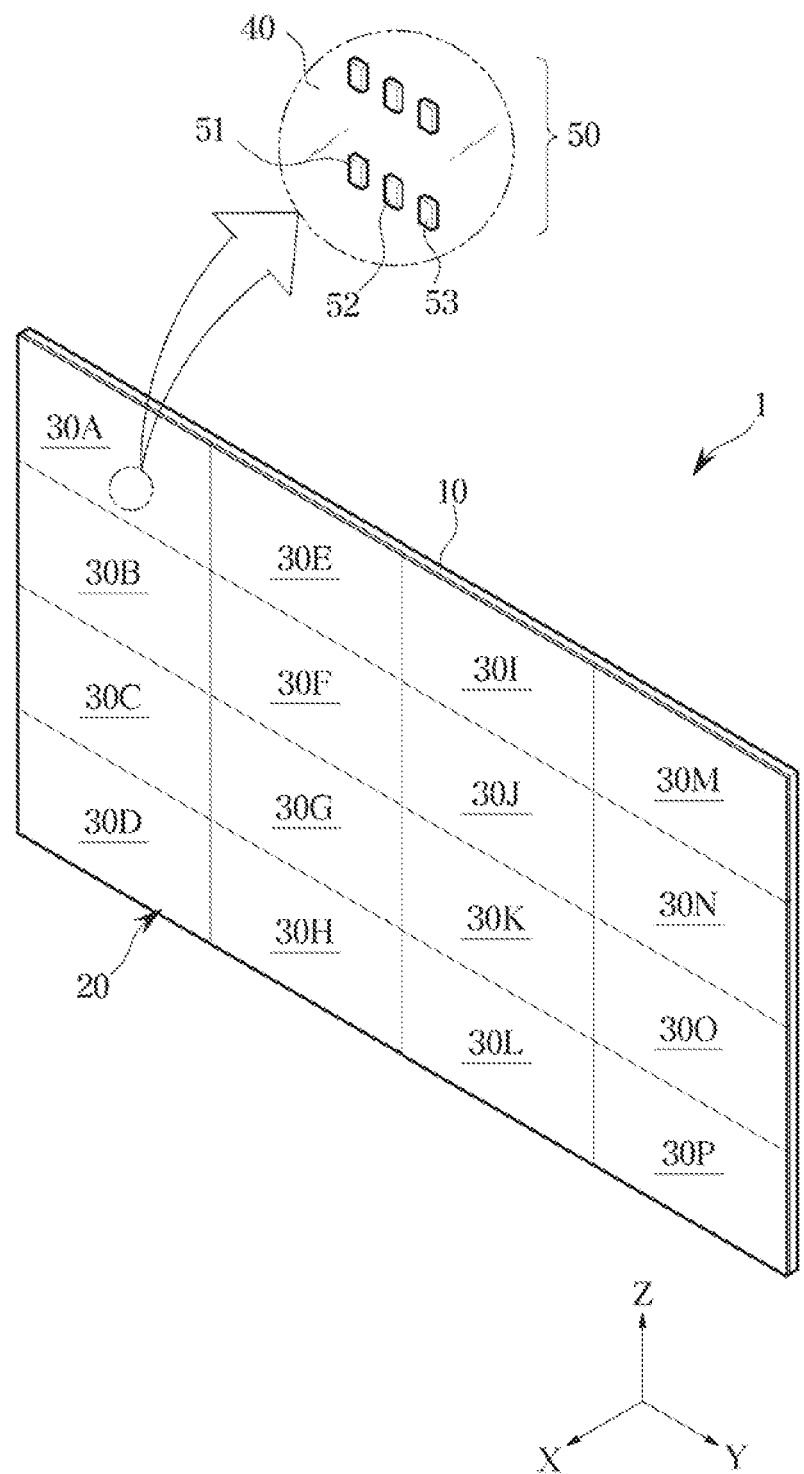
FIG. 1 is a view illustrating a display apparatus according to an embodiment.
Figure 2:
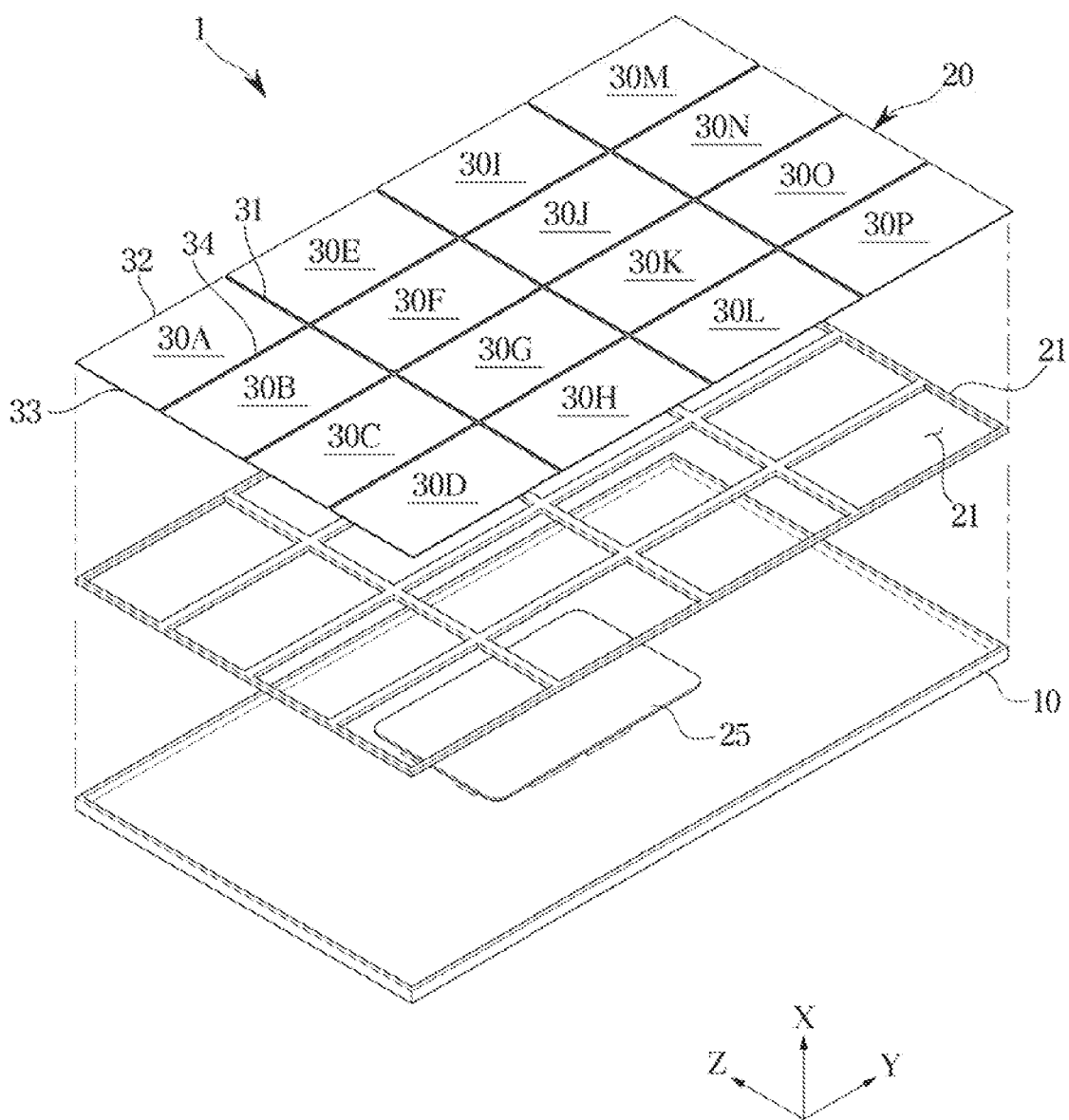
FIG. 2 is an exploded view illustrating main components of the display apparatus shown in FIG. 1.
Figure 3:
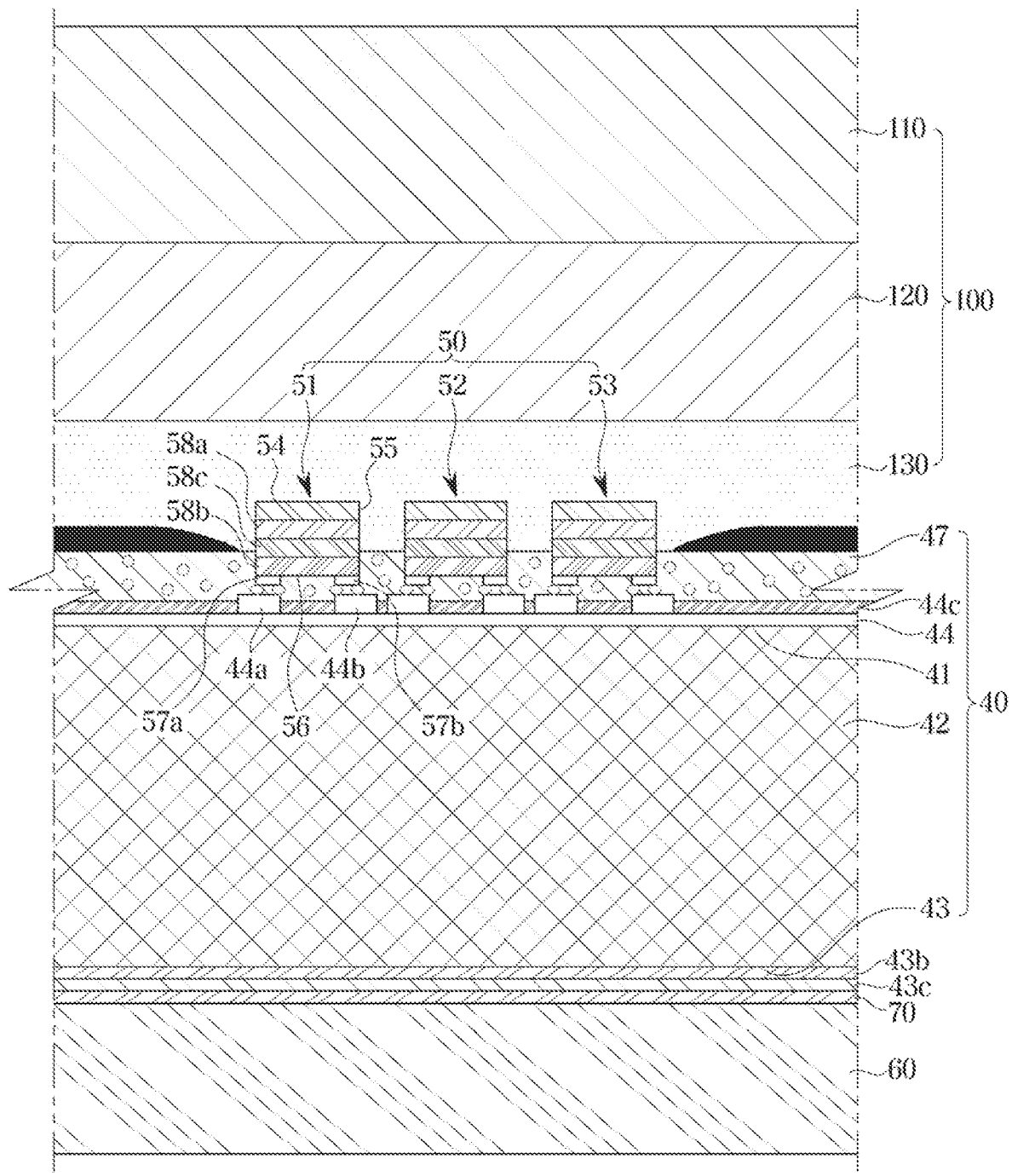
FIG. 3 is a view illustrating a substrate of the display module shown in FIG. 1.
Figure 4:
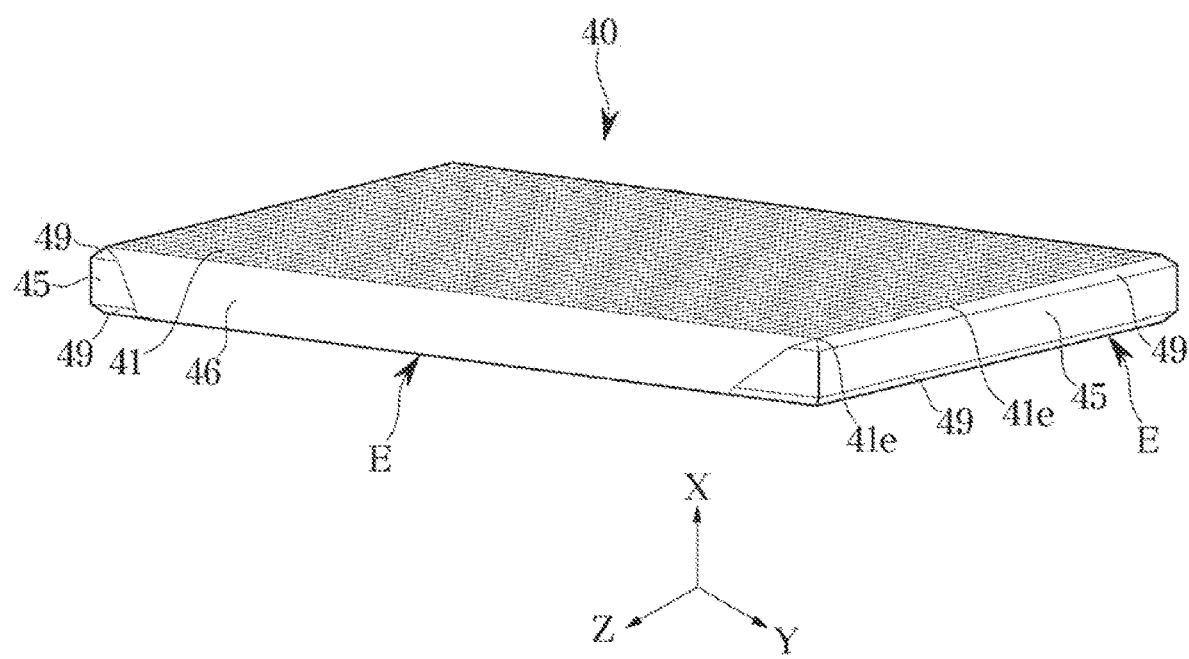
FIG. 4 is an enlarged cross-sectional view illustrating some components shown in FIG. 1.
Figure 5:
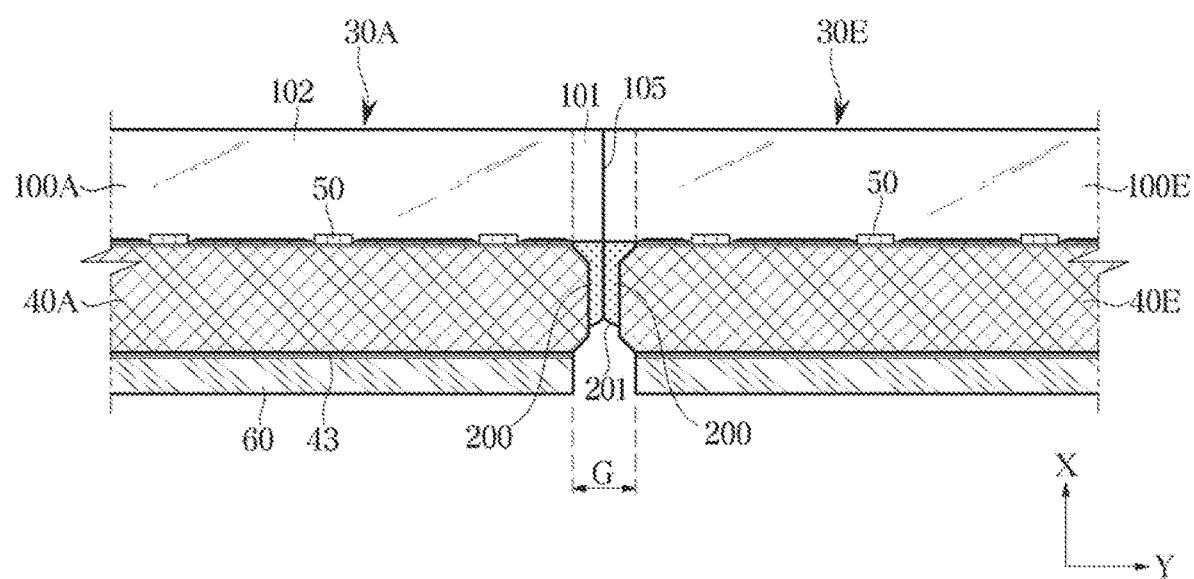
FIG. 5 is a cross-sectional view illustrating some components of the display apparatus shown in FIG. 1, which is taken along a second direction.
Figure 6:
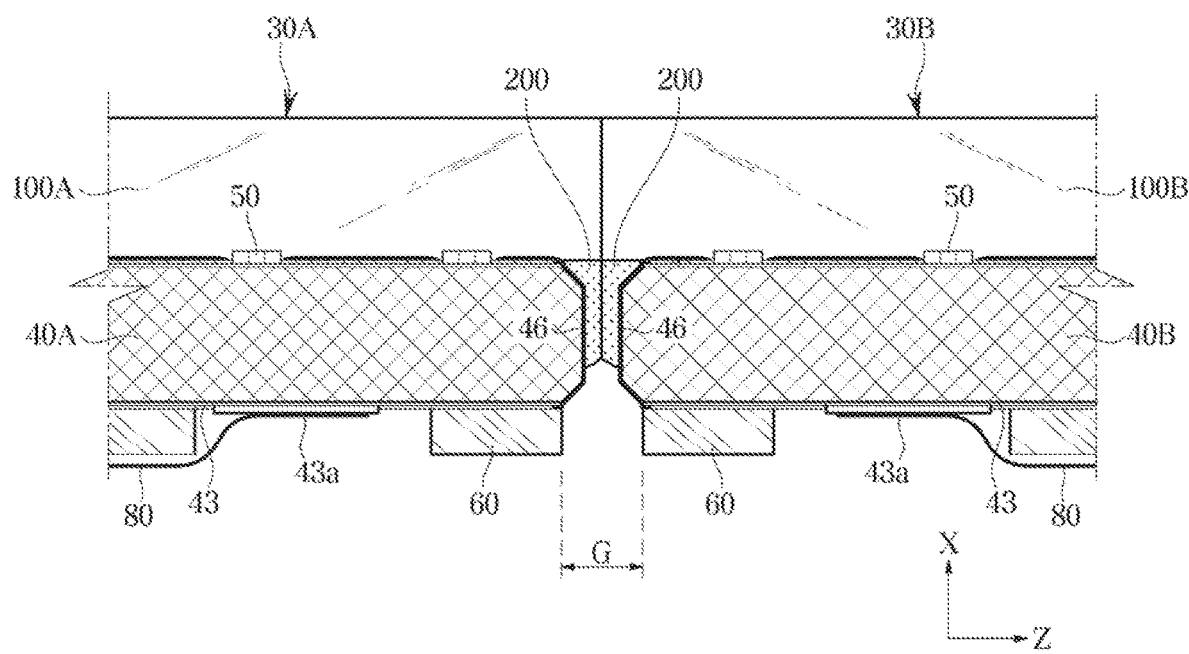
FIG. 6 is a cross-sectional view illustrating some components of the display apparatus shown in FIG. 1, which is taken along a third direction.

FIG. 1 is a view illustrating a display apparatus according to an embodiment, FIG. 2 is an exploded view illustrating main components of the display apparatus shown in FIG. 1, FIG. 3 is a view illustrating a substrate of the display module shown in FIG. 1, FIG. 4 is an enlarged cross-sectional view illustrating some components shown in FIG. 1, FIG. 5 is a cross-sectional view illustrating some components of the display apparatus shown in FIG. 1, which is taken along a second direction, and FIG. 6 is a cross-sectional view illustrating some components of the display apparatus shown in FIG. 1, which is taken along a third direction.

In the following description, components of a display apparatus 1 including a plurality of inorganic LEDs 50 shown in the drawings are components in micro-units having a size of several μm to several hundreds of μm, and the sizes of some components (a plurality of inorganic LEDs 50, a black matrix 48, etc.) shown in the drawings may be exaggerated for the sake of convenience of description.

The display apparatus 1 is a device that displays information, material, data, etc. as characters, figures, graphs, images, etc., and may be implemented as a television (TV), a personal computer (PC), a mobile, a digital signage, etc.

According to an embodiment, referring to FIGS. 1 and 2, the display apparatus 1 includes a display panel 20 displaying an image, a power supply device configured to supply power to the display panel 20, a main board 25 controlling the overall operation of the display panel 20, a frame 21 supporting the display panel 20, and a rear cover 10 covering a rear surface of the frame 21.

The display panel 20 may include a plurality of display modules 30A, 30B, 30C, 30D, 30E, 30F, 30G, 30H, 30I, 30J, 30I, 30L, 30M, 30N, 30O, and 30P, a driving board for driving each of the display modules 30A to 30P, and a Timing Controller (TCON) board generating a timing signal required for controlling each of the display modules 30A to 30P.

The rear cover 10 may support the display panel 20. The rear cover 10 may be installed on the floor through a stand, or may be installed on a wall through a hanger.

The plurality of display modules 30A to 30P may be arranged in upper to lower direction and left to right direction so as to be adjacent to each other. The plurality of display modules 30A to 30P may be arranged in an M×N matrix form, where M and N are natural numbers. In an embodiment, the display modules 30A to 30P are provided as sixteen display modules 30A to 30P and are arranged in a 4×4 matrix form, but there is no limitation on the number and arrangement method of the plurality of display modules 30A to 30P.

The plurality of display modules 30A to 30P may be installed on the frame 21. The plurality of display modules 30A to 30P may be installed on the frame 21 through various methods, such as magnetic force using a magnet or a mechanical fitting structure. The rear cover 10 is coupled to the rear of the frame 21, and the rear cover 10 may form the rear appearance of the display apparatus 1.

As described above, the display apparatus 1 according to an embodiment may implement a large screen by tiling the plurality of display modules 30A to 30P.

The plurality of display modules 30A to 30P may have the same configuration. Therefore, the description of any one display module described below may be equally applicable to all other display modules.

One of the plurality of display modules 30A to 30P, for example, the first display module 30A may be formed in a quadrangle type. Alternatively, the first display module 30A may be provided in a rectangular type or a square type.

Accordingly, the first display module 30A may include upper and lower edges 32 and 34 formed in the upper and lower sides and left and right edges 33 and 31 formed in the left and right sides with respect to a first direction X, which is the forward direction.

Referring to FIGS. 3 and 4, each of the plurality of display modules 30A to 30P may include a substrate 40 and a plurality of inorganic LEDs 50 mounted on the substrate 40.

The plurality of inorganic LEDs 50 may be mounted on a mounting surface 41 of the substrate 40 facing in the first direction X.

In FIGS. 3 and 4, the thickness of the substrate 40 in the first direction X is shown to be exaggeratedly thick for the sake of convenience of description.

The substrate 40 may be formed in a quadrangle type. As described above, the plurality of display modules 30A to 30P may be formed in a quadrangle shape, and the substrate 40 may be formed in a quadrangle shape to correspond to each display module.

The substrate 40 may be provided in a rectangular shape or a square shape.

Therefore, taking the first display module 30A as an example, the substrate 40 may include four edges E corresponding to the right, upper, left, and lower edges 31, 32, 33, and 34 of the first display module 30A.

The substrate 40 may include a mounting surface 41, a rear surface 43 formed parallel to the mounting surface 41, and a side surface 45 disposed between the mounting surface 41 and the rear surface 43.

The substrate 40 may include chamfered portions 49 formed between the mounting surface 41 and the side surface 45 and between the rear surface 43 and the side surface 45.

The chamfered portion 49 may prevent the respective substrates from being collided and damaged when the plurality of display modules 30A to 30P are arranged.

The edge E of the substrate 40 is a concept including the side surface 45 and the chamfered portion 49.

The substrate 40 include a substrate body 42 and a thin film transistor (TFT) layer 44 formed on the substrate body 42 to drive the inorganic LEDs 50. The substrate body 42 may include a glass substrate. That is, the substrate 40 may include a chip on glass (COG) type substrate. The substrate 40 may include first and second pad electrodes 44a and 44b provided to electrically connect the inorganic LEDs 50 to the TFT layer 44.

The plurality of inorganic LEDs 50 may include inorganic LEDs formed of an inorganic material and having a width, a length, and a height, each of several μm to several tens of μm. The micro-inorganic LED may have a short side of 100 μm or less among the width, the length, and the height. That is, the inorganic LED 50 may be picked up from a sapphire or silicon wafer and transferred directly onto the substrate 40. The plurality of inorganic LEDs 50 may be picked up and transported through an electrostatic method using an electrostatic head or a stamp method using an elastic polymer material, such as polydimethylsiloxane (PDMS) or silicon, as a head.

The plurality of inorganic LEDs 50 is a light emitting structure including an n-type semiconductor 58a, an active layer 58c, a p-type semiconductor 58b, a first contact electrode 57a, and a second contact electrode 57b.

Although not shown in the drawing, one of the first contact electrode 57a and the second contact electrode 57b is electrically connected to the n-type semiconductor 58a, and the other is provided to be electrically connected to the p-type semiconductor 58b.

The first contact electrode 57a and the second contact electrode 57b may be in the form of a flip chip so as to be disposed in parallel with each other while facing in the same direction (a direction opposite to the light emission direction).

The inorganic LED 50 includes a light emitting surface 54 disposed to face in the first direction X when mounted on the mounting surface 41, a side surface 55, and a bottom surface 56 disposed at a side opposite to the light emitting surface 54, and the first contact electrode 57a and the second contact electrode 57b may be formed on the bottom surface 56.

That is, the first and second contact electrodes 57a and 57b of the inorganic LED 50 may be disposed on a side opposite to the light emitting surface 54 so as to be disposed at a side opposite and facing away the light emission direction.

The first and second contact electrodes 57a and 57b may be disposed to face the mounting surface 41, may be electrically connected to the TFT layer 44, and the light emitting surface 54 may be arranged to emit light in a direction opposite and facing away from the first and second contact electrodes 57a and 57b are oriented.

Therefore, when light generated from the active layer 58c is emitted in the first direction X through the light emitting surface 54, the light may be emitted in the first direction X without interfering with the first contact electrode 57a or the second contact electrode 57b.

That is, the first direction X may be defined as a direction in which light is emitted from the light emitting surface 54.

The first contact electrode 57a and the second contact electrode 57b may be electrically connected to the first pad electrode 44a and the second pad electrode 44b formed at a side of the mounting surface 41 of the substrate 40, respectively.

As will be described below, the inorganic LED 50 may be directly connected to the first and second pad electrodes 44a and 44b through a bonding configuration, such as an anisotropic conductive layer 47 or solder.

The anisotropic conductive layer 47 may be formed on the substrate 40 to mediate electrical bonding between the first and second contact electrodes 57a and 57b and the first and second pad electrodes 44a and 44b. The anisotropic conductive layer 47 may represent an anisotropic conductive adhesive attached on a protective film, and have a structure in which conductive balls are scattered in an adhesive resin. The conductive balls may be conductive spheres surrounded by a thin insulating film, and when the insulating film is broken by a pressure, electrical connection occurs between conductors.

The anisotropic conductive layer 47 may include an anisotropic conductive film (ACF) in the form of a film and an anisotropic conductive paste (ACP) in the form of a paste.

Therefore, when the plurality of inorganic LEDs 50 are mounted on the substrate 40, a pressure applied to the anisotropic conductive layer 47 causes the insulating film of the conductive balls to be broken, so that the first and second contact electrodes 57a and 57b of the inorganic LED 50 may be electrically connected to the first and second pad electrodes 44a and 44b of the substrate 40.

Although not shown in the drawing, the plurality of inorganic LEDs 50 may be mounted on the substrate 40 through a solder instead of the anisotropic conductive layer 47. The inorganic LED 50 may be aligned on the substrate 40 first, and then the inorganic LED 50 may be subject to a reflow process to be bonded to the substrate 40.

The plurality of inorganic LEDs 50 may include a red LED 51, a green LED 52, and a blue LED 53, and the inorganic LEDs 50 may be mounted on the mounting surface 41 of the substrate 40 in a series of the red LEDs 51, the green LEDs 52, and the blue LEDs 53 as one unit. A series of the red LEDs 51, the green LEDs 52, and the blue LEDs 53 may form one pixel. In this case, the red LED 51, the green LED 52, and the blue LED 53 may each form a sub-pixel.

The red LED 51, the green LED 52, and the blue LED 53 may be arranged in a line at predetermined intervals as in an embodiment, or may be arranged in a different shape, such as a triangular shape.

The substrate 40 may include a light absorbing layer 44c to improve the contrast by absorbing external light. The light absorbing layer 44c may be formed on the mounting surface 41 of the substrate 40 as a whole. The light absorbing layer 44c may be formed between the TFT layer 44 and the anisotropic conductive layer 47.

The plurality of display modules 30A to 30P may further include a black matrix 48 formed between the plurality of inorganic LEDs 50.

The black matrix 48 may perform a function of supplementing the light absorbing layer 44c entirely formed at a side of the mounting surface 41 of the substrate 40. That is, the black matrix 48 absorbs external light and allows the substrate 40 to appear black, thereby improving the contrast of the screen.

The black matrix 48 may have a black color.

In an embodiment, the black matrix 48 is formed to be disposed between pixels each formed by a series of the red LEDs 51, the green LEDs 52, and the blue LEDs 53. In an embodiment, the black matrix 48 may be formed at a higher precision and partition each of the red, green, and blue LEDs 51, 52, and 53, which are sub-pixels.

The black matrix 48 may be formed in a grid shape having a horizontal pattern and a vertical pattern so as to be disposed between pixels.

The black matrix 48 may be formed by applying a light-absorbing ink on the anisotropic conductive layer 47 through an ink-jet process and curing the light-absorbing ink, or by coating a light-absorbing film on the anisotropic conductive layer 47.

That is, on the anisotropic conductive layer 47 formed entirely on the mounting surface 41, the black matrices 48 may be formed gaps between the plurality of inorganic LEDs 50 in which the plurality of inorganic LEDs 50 are not mounted.

The display module 30A may include a driving circuit board (not shown) provided to electrically control the plurality of inorganic LEDs 50 mounted on the mounting surface 41. The driving circuit board (not shown) may be electrically connected to the inorganic LEDs 50 to supply power to the plurality of inorganic LEDs 50 and transmit electrical signals to control the respective driving thereof.

The display module 30A may include a metal plate 60 disposed on the rear surface 43 of the substrate 40 and provided to dissipate heat generated from the substrate 40.

The display module 30A may include an adhesive tape 70 disposed between the rear surface 43 and the metal plate 60 to bond the rear surface 43 of the substrate 40 and the metal plate 60 to each other.

The plurality of inorganic LEDs 50 may be electrically connected to a pixel driving wiring (not shown) formed on the mounting surface 41 and an upper surface wiring layer (not shown) extending through the side surface 45 of the substrate 40 and formed of the pixel driving wiring (not shown).

The upper surface wiring layer (not shown) may be formed under the anisotropic conductive layer 47.

The upper surface wiring layer (not shown) may be electrically connected to a side surface wiring 46 formed on the side surface 45 of the substrate 40. The side surface wiring 46 may be provided in the form of a thin film as shown in FIG. 4.

The upper surface wiring layer (not shown) may be connected to the side surface wiring 46 by an upper surface connection pad (not shown) formed on a side of an edge 41e of the substrate 40.

The side surface wiring 46 may extend along the side surface 45 of the substrate 40 and may be connected to a rear surface wiring layer 43b formed on the rear surface 43 and to the driving circuit board disposed at the rear surface 43.

An insulating layer 43c covering the rear surface wiring layer 43b may be formed on the rear surface wiring layer 43b in a direction in which the rear surface 43 of the substrate 40 faces.

That is, the plurality of inorganic LEDs 50 may be sequentially electrically connected to the upper surface wiring layer (not shown), the side surface wiring 46, and the rear surface wiring layer 43b.

The driving circuit board (not shown) may be disposed on the rear surface 43 of the substrate 40 in the first direction X.

The display module 30A includes a flexible film 80 connecting the driving circuit board (not shown) to the rear surface wiring layer 43b so that the driving circuit board (not shown) is electrically connected to the plurality of inorganic LEDs 50 (see FIG. 6).

In detail, one end of the flexible film 80 may be connected to a rear surface connection pad 43a disposed on the rear surface 43 of the substrate 40 and electrically connected to the plurality of inorganic LEDs 50.

The rear surface connection pad 43a may be electrically connected to the rear surface wiring layer 43b. Accordingly, the rear surface connection pad 43a may electrically connect the rear surface wiring layer 43b to the flexible film 80.

As the flexible film 80 is electrically connected to the rear surface connection pad 43a, power and an electrical signal from the driving circuit board (not shown) may be transmitted to the plurality of inorganic LEDs 50.

The flexible film 80 and the driving circuit board (not shown) may be disposed on the rear surface 43 of the substrate 40.

With respect to the first direction X facing in the forward direction of the display apparatus 1, when a direction perpendicular to the first direction X and facing in a left-right direction of the display apparatus 1 is assumed as a second direction Y, and a direction perpendicular to the first direction X and the second direction Y and facing in a upper-lower direction of the display apparatus 1 is assumed as a third direction Z, the side surface wiring 46 may extend to the rear surface 43 of the substrate 40 along the chamfered portion 49 and the side surface 45 of the substrate 40 along the third direction Z.

However, an embodiment is not limited thereto, and the side surface wiring 46 may extend to the rear surface 43 of the substrate 40 along the chamfered portion 49 and the side surface 45 of the substrate 40 along the second direction Y.

According to an embodiment, the side surface wiring 46 may be provided to extend along a side of an edge E of the substrate 40 corresponding to the upper edge 32 and the lower edge 34 of the first display module 30A.

However, an embodiment is not limited thereto, and the side surface wiring 46 may extend along the edge E of the substrate 40 corresponding to at least two of the right, upper, left, and lower edges 31, 32, 33, and 34 of the first display module 30A.

The plurality of display modules 30A to 30P may include covers 100 disposed on the mounting surfaces 41 in the first direction X to cover the mounting surfaces 41 of the plurality of display modules 30A to 30P, respectively.

Referring to FIGS. 5 and 6, the plurality of covers 100 may be provided so as to be respectively formed on the upper sides of the plurality of display modules 30A to 30P in the first direction X. For convenience of description, the display module 30A will be referred to as a first display module 30A, the display module 30E will be referred to as a second display module 30E, and the display module 30B will be referred to as a third display module 30B.

Each of the plurality of display modules 30A to 30P may be assembled after a separate cover 100 is formed. That is, when taking the first display module 30A, the second display module 30E, and the third display module 30B as an example among the plurality of display modules 30A to 30P, a first cover 100A may be bonded on the mounting surface 41 of the first display module 30A, a second cover 100E may be formed on the mounting surface 41 of the second display module 30E, and a third cover 100B may be formed on the mounting surface 41 of the third display module 30B.

The second display module 30E is one of the plurality of display modules 30A to 30P disposed adjacent to the first display module 30A in the second direction Y, which is a left-right direction with respect to the first direction X, which is the forward direction, on a substrate 40E.

The third display module 30B is one of the plurality of display modules 30A to 30P disposed adjacent to the first display module 30A in the third direction Z, which is an upper-lower direction with respect to the first direction X, which is the forward direction, on a substrate 40B.

The cover 100 may cover the front side of the substrate 40 and the mounting surface 41 to protect the substrate 40 from external force. In addition, the cover 100 may reduce the revelation of a seam formed by a gap G formed between the plurality of display modules 30A to 30P, and improve color deviation between the plurality of display modules 30A to 30P.

The plurality of display modules 30A to 30P may include side surface members 200 disposed in gaps G formed between the plurality of display modules 30A to 30P when the plurality of display modules 30A to 30P are arrayed.

The side surface members 200 are provided to absorb light incident onto the gaps G formed between the plurality of display modules 30A to 30P. Accordingly, the revelation of a seam formed by the gaps G formed between the plurality of display modules 30A to 30P may be reduced.

Hereinafter, the cover 100 and the side surface member 200 will be described in detail.

Figure 7:
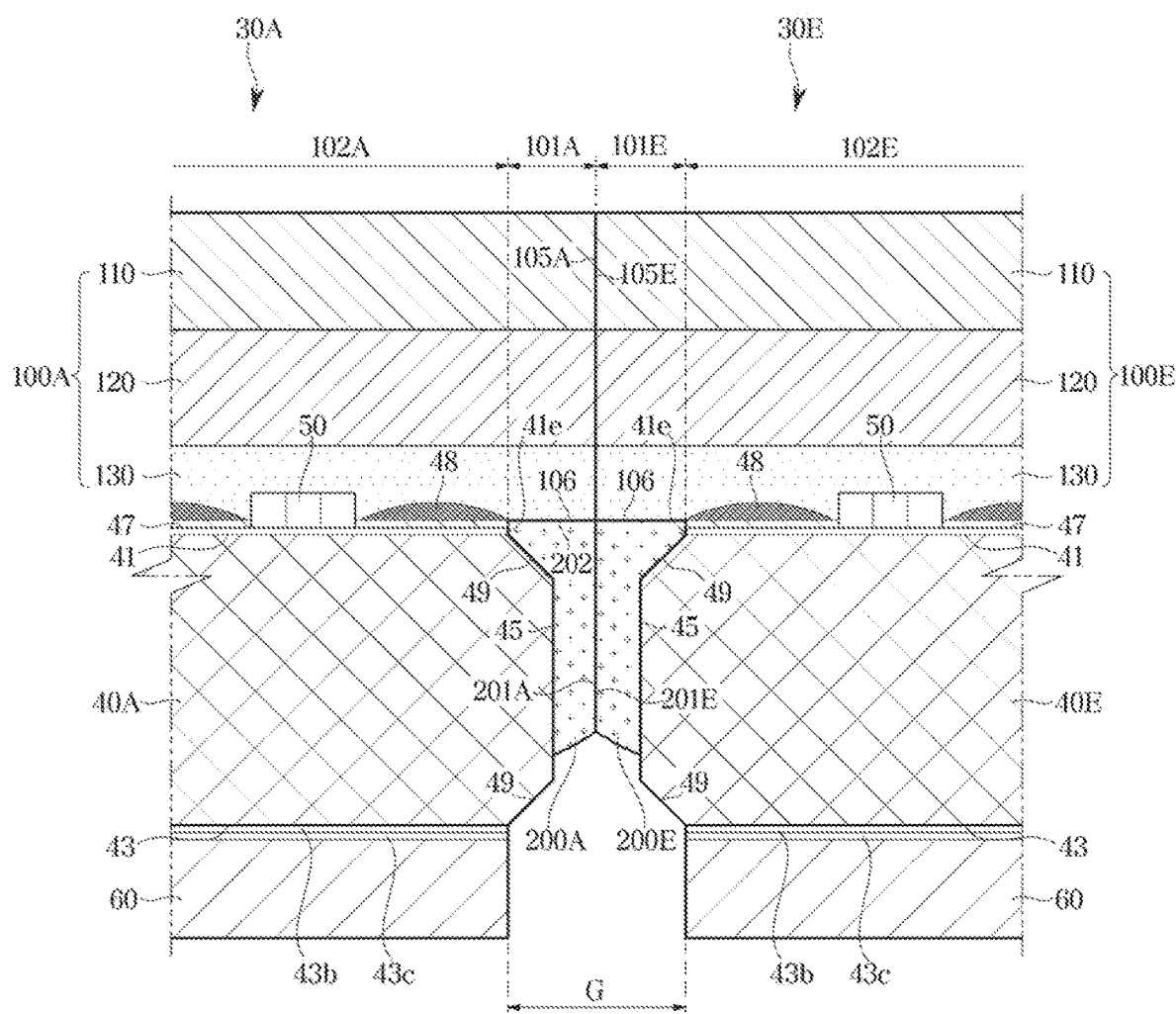
FIG. 7 is an enlarged cross-sectional view illustrating some components shown in FIG. 5.
Figure 8:
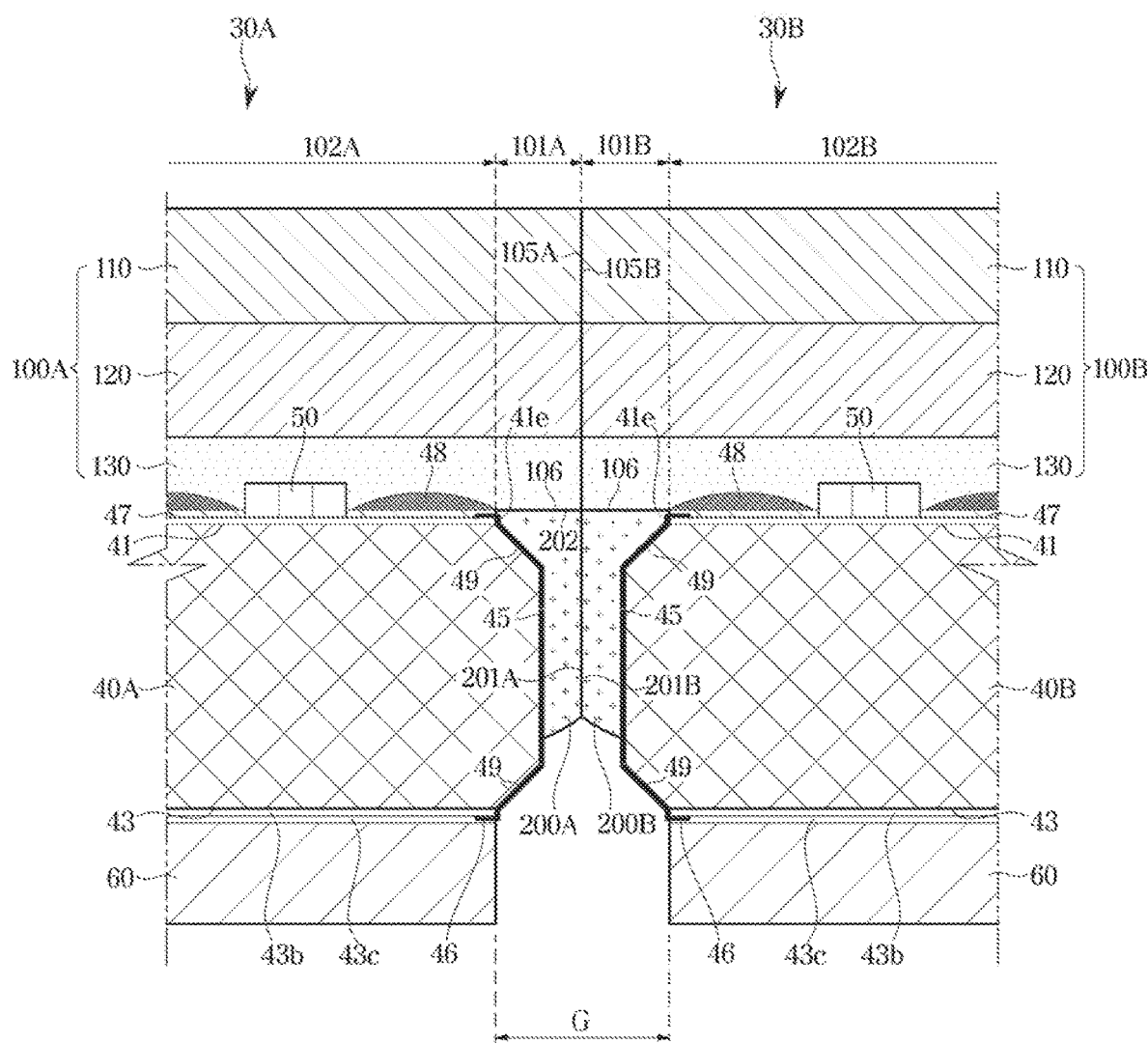
FIG. 8 is an enlarged cross-sectional view illustrating some components shown in FIG. 6.

FIG. 7 is an enlarged cross-sectional view illustrating some components shown in FIG. 5, and FIG. 8 is an enlarged cross-sectional view illustrating some components shown in FIG. 6.

Since the plurality of display modules 30A to 30P are formed identical to each other, the plurality of display modules 30A to 30P will be described in relation to the first display module 30A.

That is, in order to avoid redundant descriptions, the configuration of the plurality of display modules 30A to 30P will be described in relation to the display module 30, the substrate 40, the cover 100, and the side surface member 200 as an example.

In addition, as needed, the first display module 30A, the second display module 30E disposed adjacent to the first display module 30A in the second direction Y, and the third display module 30B disposed adjacent to the first display module 30A in the third direction Z among the plurality of display modules 30A to 30P will be described as needed.

In addition, since the plurality of display modules 30A to 30P is formed identical to each other, the covers 100 formed on the plurality of display modules 30A to 30P will be described in relation to the first cover 100A of the first display module 30A, the second cover 100E of the second display module 30E, and the third cover 100B of the third display module 30B as an example.

In order to absorb light reflected from the gaps G between the plurality of display modules 30A to 30P, the cover 100 of each of the plurality of display modules 30A to 30P may be formed to extend an area outside the substrate 40 of each of the plurality of display modules 30A to 30P.

In detail, the cover 100 may be provided to extend to areas outside the edges 41e of the mounting surface 41 of the substrate 40 in the second direction Y and the third direction Z.

Substantially, a gap between the display modules 30A to 30P may be formed between the side surfaces 45 of the substrates 40 of the display modules 30A to 30P, but since the gap G according to an embodiment refers to a non-display area that may be formed between the display modules 30A to 30P, the gap G formed between the plurality of display modules 30A to 30P should be understood as a gap from one of the edges 41e of the mounting surfaces 41 of the substrates 40 of the display modules 30A to 30P to another one of the edges 41e of the mounting surfaces 41 of the substrates 40 of the display modules 30A to 30P adjacent to the one edge 41e.

Therefore, the gap G formed between the plurality of display modules 30A to 30P refers to a gap formed between one of the edges 41e of the mounting surfaces 41 of the display modules 30A to 30P and another one of the edges 41e of the mounting surfaces 41 of the display modules 30A to 30P adjacent to the one edge 41e in the second direction Y or the third direction Z.

The cover 100 extending from each of the display modules 30A to 30P is arranged in the gap G between the plurality of display modules 30A to 30P to absorb light transmitted to the gap G or light reflected from the gap G, thereby minimizing the perception of a seam.

In addition, as will be described below, light directed to the gap G may be absorbed by the side surface members 200 of the plurality of display modules 30A to 30P disposed between the gap G, so that the perception of the seam may be minimized.

Referring to FIG. 7, the cover 100 may extend to the outside of the substrate 40 in the second direction Y. In detail, the cover 100 may be provided to extend an area outside the side surface 45 and the chamfered portion 49 in the second direction Y.

An embodiment is described in relation to one edge of the substrate 40 corresponding to the right edge 31 of the first display module 30A, but the cover 100 may extend to areas outside the four edges E of the substrate 40 in the second direction Y or the third direction Z.

That is, side end portions 105 of the cover 100 corresponding to edges of the cover 100 may extend to areas outside the four edges E of the substrate 40 in the second direction Y or the third direction Z.

The cover 100 may include a first layer 110 disposed at the outermost side of the display module 30 in the first direction X and a second layer 120 disposed behind the first layer 110. The first and second layers 110 and 120 may be stacked one on top of the other in the first direction X.

The first layer 110 may be provided as an anti-glare layer. However, an embodiment is not limited thereto, and the first layer 110 may be formed of a layer including a different physical property or material or having a different function. For example, the first layer 110 may be provided as an anti-reflective layer or a layer in which an anti-glare layer and an anti-reflective layer are mixed.

The second layer 120 may be provided as a light transmittance control layer. However, an embodiment is not limited thereto, and the second layer 120 may be formed of a layer including different physical property or material or having a different function. For example, the second layer 120 may be provided as a circularly polarized light layer.

In addition, an embodiment is not limited to the embodiment, and the first layer 110 and the second layer 120 may be provided as a single layer. The single layer may be formed only with the first layer 110 or only with the second layer 120. In addition, the single layer may be provided as a layer capable of functionally implementing both the functions of the first layer 110 and the second layer 120.

The cover 100 may include an adhesive layer 130 that allows t the first layer 110 and the second layer 120 to be directly bonded to the mounting surface 41 in the first direction X. The adhesive layer 130 may be disposed at the rearmost side of the cover 100 in the first direction X.

However, an embodiment is not limited thereto, and the adhesive layer 130 may be provided as a component of the substrate 40, rather than a component of the cover 100, that is arranged on the uppermost surface of the mounting surface 41 in the first direction X such that the cover 100 is bonded to the mounting surface 41.

The adhesive layer 130 may be formed of a transparent material so that light may be easily transmitted therethrough. In an embodiment, the adhesive layer 130 may be in a highly transparent state having a transmittance of 90% or more, such as an optically transparent resin (OCR).

The OCRs may improve visibility and image quality by increasing transmittance through low-reflection properties. That is, in a structure having an air gap, light loss occurs due to a difference in refractive index between a film layer and an air layer, but in a structure using an OCR, the difference in refractive index decreases, thereby reducing light loss and consequently improving visibility and image quality.

That is, the OCR may improve image quality as well as protecting the substrate 40.

Typically, the adhesive layer 130 may be provided to have a predetermined height or larger in the first direction X in which the mounting surface 41 faces.

This is to sufficiently fill a gap that may be formed between the adhesive layer 130 and the plurality of inorganic LEDs 50 when the adhesive layer 130 is bonded to the substrate 40.

The plurality of inorganic LEDs 50 mounted on the mounting surface 41 are disposed to protrude than the mounting surface 41 in the first direction X, and thus an uneven portion may be formed on the mounting surface 41 due to the plurality of inorganic LEDs 50.

The adhesive layer 130 is bonded to the mounting surface 41 by being compression-hardened on the mounting surface 41, and in a process of the adhesive layer 130 being hardened, a void region may be formed between the mounting surface 41 and the adhesive layer 130 due to the uneven portion formed by the plurality of inorganic LEDs 50, which may cause air bubbles to be formed.

However, when the adhesive layer 130 is formed to have a certain height, the adhesive layer 130 may be formed even on the inner side of the uneven portion formed on the mounting surface 41 during the compression hardening.

Accordingly, the adhesive layer 130 may be bonded to the mounting surface 41 without an empty space between the mounting surface 41 and the adhesive layer 130.

The adhesive layer 130 is closely bonded to the mounting surface 41 and protects components on the mounting surface 41 described above, so that the display module 30 may be provided such that the cover 100 is directly bonded to the substrate 40 without an additional molding configuration formed between the cover 100 and the substrate 40.

As described above, the first layer 110 and the second layer 120 may be provided as layers each having different functions. In addition, the first layer 110 and the second layer 120 may be provided as a single layer.

However, in the following description, an example in which the first layer 110 is provided as an anti-glare layer and the second layer 120 is provided as a light transmittance control layer will be illustrated for the sake of convenience in description.

The first layer 110 may diffusely reflects the light incident from the outside so as to prevent the externally incident light from being regularly reflected and dazzling the user.

As light incident from the outside is diffusely reflected, a glare phenomenon may be reduced and the contrast of a screen displayed on the display panel 20 may be improved.

The second layer 120 may be ay reduce the transmittance of incident external light or the transmittance of external light reflected from the substrate 40 and the gap G.

The second layer 120 according to an embodiment includes a material of a component that lowers the transmittance of light so as to allow at least a part of light to be transmitted to the substrate 40 therethrough or absorb at least a part of light reflected from the substrate 40 and proceeding in the first direction X.

The second layer 120 may have a transparency lower than that of the adhesive layer 130 in order to lower the transmittance of light. When a plurality of substrates are produced, some substrates may have different colors due to process errors during the production. Accordingly, substrates having different unique colors may be tiled to form a single display panel.

As described above, the second layer 120 according to an embodiment absorbs at least a part of light reflected from the substrate 40 and transmitted to the outside, thereby increasing the sense of unity of the screen of the display panel 20.

That is, the second layer 120 may reduce the color deviation of each display module 30A to 30P occurring due to process errors of the display module 30A to 30P by lowering the external light transmittance.

The first layer 110 may prevent external light incident onto the display panel 20 from being transmitted to the substrate 40, and the second layer 120 may absorb a part of light incident onto the display panel 20 from the outside or absorb a part of external light reflected from the substrate 40 and transmitted to the outside of the display panel 20 to improve the contrast of a screen displayed on the display panel.

That is, the cover 100 may be disposed in front of the substrate 40 in the first direction X to improve the contrast that may be degraded by external light on the screen displayed on the display panel 20.

As described above, in the case of the display module 30 according to an embodiment, the cover 100 may extend outside of the substrate 40 in the second direction Y.

Accordingly, a part of the light introduced into the gap G formed between the plurality of display modules 30A to 30P may be blocked by at least a part of the first layer 110 disposed in the gap G, and at least a part of external light introduced into the gap G or reflected in the gap G may be absorbed by the second layer 120 disposed in the gap G and prevented from being transmitted to the outside. Accordingly, the revelation of a seam formed in the gap G may be reduced, and the sense of unity of the screen displayed on the display panel 20 may be improved as the revelation of the seam decreases.

In detail, the side portion of the cover 100 in the second direction Y may be arranged outside the edge 41e of the mounting surface 41 in the second direction Y, or in the gap G.

Accordingly, the cover 100 may include a first region 101 disposed outside the edge 41e of the mounting surface 41 in the second direction Y or disposed in the gap G and a second region 102 disposed on the mounting surface 41.

The first region 101 and the second region 102 of the cover 100 may be divided may by a gap G in the second direction Y.

The first region 101 of the cover 100 is disposed in the gap G so that external light directed to the gap G may be blocked by the first region 101 of the cover 100, or light reflected from the gap G and then directed to the outside is blocked by the first region 101 of the cover 100 so that the revelation of a seam, which may be formed by the gap Gas a boundary between the plurality of display modules 30A to 30P, is reduced and the sense of unity of the display panel 20 is improved.

The cover 100 may be provided to extend to an area outside the four edges 41e of the mounting surface 41 of the substrate 40 as described above, thereby reducing revelation of a seam that may be formed at each of the edges of the plurality of display modules 30A to 30P.

Taking the first display module 30A and the second display module 30E as an example, the first region 101A of the first cover 100A extending from the first display module 30A may be disposed in the gap G formed between the first display module 30A and the second display module 30E.

In the gap G, side end portions 105A and 105E adjacent to each other of side end portions of the first and second covers 100A and 100E of the first and second display modules 30A and 30E may be disposed.

In addition, the side surfaces 45 and the chamfered portions 49 of the first and second display modules 30A and 30E may be disposed in the gap G.

The second region 102A of the first cover 100A may be disposed on the mounting surface 41 of the first display module 30A.

The first region 101E of the second cover 100E extending from the second display module 30E may be disposed in the gap G formed between the first display module 30A and the second display module 30E, and the second region 102E of the second cover 100E may be disposed on the mounting surface 41 of the second display module 30E.

That is, in the gap G formed between the first display module 30A and the second display module 30E, the first regions 101A and 101E of the first cover 100A and the second cover 100E are arranged in parallel to each other in the second direction Y.

The first regions 101A and 101E of the first and second covers 100A and 100E may each extend in the second direction Y by a length equal to or less than half of the gap G.

Accordingly, when the first regions 101A and 101E of the first and second covers 100A and 100E are arranged in parallel to each other in the second direction Y, the summation of the lengths of the first regions 101A and 101E may be equal to or smaller than the length of the gap Gin the second direction Y.

According to an embodiment, when the first regions 101A and 101E of the first and second covers 100A and 100E are arranged in parallel to each other in the second direction Y, a predetermined spacing may exist between the side end portion 105A of the first cover 100A and the side end portion 105E of the second cover 100E.

However, an embodiment is not limited thereto, and the first display module 30A and the second display module 30E may be tiled without a spacing between the first region 101A of the first cover 100A and the first region 101E of the second cover 100E.

As described above, in the gap G between the first display module 30A and the second display module 30E, the first region 101A of the first cover 100A and the first region 101E of the second cover 100E may be arranged.

External light directed to the display panel 20 is transmitted through the first regions 101A and 101E of the first and second covers 100A and 100E, by which the external light is diffusely reflected to the outside or is partially absorbed by the first regions 101A and 101E, so that the amount of light reaching the gap G is reduced and the revelation of the boundary between the first display module 30A and the second display module 30E due to the gap G may be reduced.

In addition, light reflected from the gap G and directed to the outside of the display panel 20 is transmitted through the first regions 101A and 101E of the first and second covers 100A and 100E, by which the light is diffusely reflected outside of the display panel 20 or partially absorbed by the first regions 101A and 101E so that the amount of light transmitted to the outside of the display panel 20 is reduced and the revelation of the boundary between the first display module 30A and the second display module 30E due to the gap G may be reduced.

That is, the amount of external light introduced into the gap G formed between the plurality of display modules 30A to 30P may be reduced while at least part of external light reflected from the gap G may be absorbed, so that the sense of unity of the screen of the display panel 20 may be improved.

Additionally, even when the substrate 40A of the first display module 30A and the substrate 40E of the second display module 30E have different colors, when each of the substrates 40A and 40E is displayed to the outside by reflection of external light, at least a part of the reflected light is absorbed by a corresponding one of the first and second covers 100A and 100E, so that the unique color of each of the substrates 40A and 40E is not perceived to the outside, so that the sense of unity of the screen may be improved.

The display module 30A may include the side surface member 200 disposed below the cover 100 in a direction in which the mounting surface 41 faces, and provided on the side surface 45 of the substrate 40.

In detail, the side surface member 200 may be disposed in a space formed on a lower surface 106 of the first region 101 of the cover 100 in the first direction X and a side surface 45 of the substrate 40 in the second direction Y.

The side surface member 200 may be provided to be bonded to at least a portion of the lower surface 106 of the first region 101 and the side surface 45. The side surface member 200 may be provided to be bonded to the entire area of the lower surface 106 of the first region 101.

Here, the lower surface 106 of the first region 101 refers to the lower surface of the cover 100, that is, a rear surface of the adhesive layer 130 formed at the rearmost end of the cover 100.

According to an embodiment, the side surface member 200 is illustrated as covering only a part of the side surface 45 in the first direction X, but an embodiment is not limited thereto, and the side surface member 200 may be provided to cover the entire area of the side surface 45 in the first direction X.

Therefore, when the side surface member 200 is referred to as covering the side surface 45, it should be understood that the side surface member 200 covers a part of the side surface 45 or covers the entire area of the side surface 45. Therefore, hereinafter, the side surface member 200 may be referred to as covering the side surface 45.

In addition, the side surface member 200 may be provided to cover all of the pair of chamfered portions 49 disposed in the front-rear direction of the side surface 45 in the first direction X.

The side surface member 200 may be provided to surround the entire area of the chamfered portion 49 formed between the mounting surface 41 and the side surface 45 as well as the side surface 45.

As the side surface member 200 is provided to surround the chamfered portion 49 formed between the mounting surface 41 and the side surface 45, the side surface member 200 may fill all spaces that may be generated between the substrate 40 and the cover 100.

Accordingly, the side surface member 200 may prevent foreign substances or moisture from entering the space between the substrate 40 and the cover 100 from the outside.

The side surface member 200 may be provided to come in contact with the lower surface 106 of the first region 101 and the chamfered portion 49 and the side surface 45 of the substrate 40. Accordingly, the side surface member 200 may support the lower surface 106 of the first region 101 and the chamfered portion 49 and the side surface 45 of the substrate 40.

As described above, the cover 100 and the substrate 40 are bonded to each other by the adhesive layer 130, and the adhesiveness between the cover 100 and the substrate 40 may be strengthened by the side surface member 200. Accordingly, the side surface member 200 may prevent the cover 100 from being separated from the substrate 40.

That is, the reliability of the display module 30A may be increased by the side surface member 200.

As described above, the side surfaces 45 of the substrate 40 are provided to correspond to the four edges 41e of the mounting surface 41, and the first regions 101 of the cover 100 may extend to areas outside the four edges 41e of the mounting surface 41 in the second direction Y and the third direction Z, that is, the directions in which the mounting surface 41 extends.

The side surface member 200 may be provided to surround the lower surface 106 of the first region and the side surfaces 45 corresponding to the four edges 41e of the mounting surface 41 along the circumferences of the four edges 41e of the mounting surface 41.

That is, the side surface member 200 may be provided to seal the entire edge of the portion where the substrate 40 and the cover 100 are bonded to each other.

The side surface member 200 may cover the lower surface 106 of the first region 101 and the side surface 45 in all directions perpendicular to the first direction X.

Accordingly, the coupling between the cover 100 and the substrate 40 may be improved, and the cover 100 and the side surface 45 of the substrate 40 may be protected from external forces.

In addition, as described above, the side surface member 200 may prevent external moisture or foreign substances from penetrating between the substrate 40 and the cover 100. Additionally, when some gaps are formed due to an adhesive failure between the substrate 40 and the cover 100, the side surface member 200 may prevent external moisture or foreign substances from penetrating into the gaps.

The side surface member 200 is provided to surround all four edges E of the substrate 40 along the side surfaces 45 of the substrate 40, thereby sealing a space between the substrate 40 and the cover 100.

Accordingly, the side surface member 200 may prevent foreign substances or moisture from penetrating between the substrate 40 and the cover 100 even when foreign substances or moisture enter the substrate 40 in any direction.

As described above, the rearmost end of the cover 100 in the first direction X is provided as the adhesive layer 130, and the lower surface 106 of the first region 101 is provided as the rear surface of the adhesive layer 130.

Accordingly, when the lower surface 106 of the first region 101 is exposed to the outside, foreign substances flowing from the outside may be attached to the lower surface 106 of the first region 101.

When the plurality of display modules 30A to 30P are arrayed in a state in which foreign substances are attached to the lower surface 106 of the first region 101, the foreign substances attached to the lower surface 106 of the first region 101 may increase the visibility of a seam generated between the plurality of display modules 30A to 30P.

However, the display module 30A according to an embodiment includes the side surface member 200, and the side surface member 200 is provided to cover the lower surface 106 of the first region 101, so that foreign substances are prevented from being attached to the lower surface 106 of the first region 101.

Accordingly, when the plurality of display modules 30A to 30P are arrayed, the visibility of a seam generated between the plurality of display modules 30A to 30P due to foreign substances attached to the cover 100 may be reduced.

As described above, the side surface member 200 may be provided to be disposed below the cover 100 in a direction in which the mounting surface 41 faces. That is, the side surface member 200 is not disposed above the lower surface 106 in the first direction X.

A front most surface 202 of the side surface member 200 in the first direction X is provided in contact with the lower surface 106 of the first region 101, and is not placed in front of the lower surface 106 of the first region 101 in the first direction X.

This is to avoid disposing the side surface member 200 on a movement path of light emitted from the plurality of inorganic LEDs 50.

When at least a portion of the side surface member 200 is disposed in front of the lower surface 106 or in front of the cover 100 in the first direction X, the at least a portion of the side surface member 200 may be disposed on the path of light moving forward through the cover 100.

That is, because the side surface member 200 absorbs or diffusely reflects a portion of the moving light, a portion of an image displayed on the display panel 20 may be distorted.

However, the side surface member 200 according to an embodiment is disposed behind the cover 100 in the first direction X and does not restrict the movement of light emitted by the plurality of inorganic LEDs 50 so that the image quality of the display panel 20 may be improved.

The side end portion 105 of the cover 100 in the second direction Y and an end portion 201 of the side surface member 200 in the second direction Y are disposed on the same line in the first direction X. The side end portion 105 of the cover 100 and the end portion 201 of the side surface member 200 in a direction parallel to the first direction X may be disposed on the same line.

This is because the cover 100 and the side surface member 200 are simultaneously cut during the manufacturing process of the display module 30A, as will be described below.

Accordingly, when the plurality of display modules 30A to 30P are arrayed, the spacing formed between the plurality of display modules 30A to 30P is minimized, and a seam visually recognized by the spacing between the plurality of display modules 30A to 30P may be minimized.

The side surface member 200 may include a material that absorbs light. For example, the side surface member 200 may be formed of an opaque material or a translucent material.

In addition, the side surface member 200 may include a photosensitive material. For example, the side surface member 200 may be formed of a photosensitive optically transparent adhesive resin (optical clear resin, OCR). When the photosensitive material is irradiated with external light having a wavelength other than that of visible light, such as ultraviolet (UV) light, physical properties of the photosensitive material are changed and the color of the photosensitive material may be changed to a dark color.

Accordingly, the side surface member 200 is formed of a material configured to be colored dark when irradiated with UV light during the manufacturing process, to absorb light.

The side surface member 200 may be provided to have a dark color. The side surface member 200 may be provided to have a color darker than that of the cover 100.

The side surface member 200 may be provided to have a color similar to that of the black matrix 48.

Accordingly, light incident to the side surface member 200 may be absorbed by the side surface member 200 due to the light absorbing material of the side surface member 200 without being reflected.

The side surface member 200 may be disposed formed on the gap G formed between the plurality of display modules 30A to 30P together with the first region 101 of the cover 100 when the plurality of display modules 30A to 30P are arrayed.

Accordingly, the side surface member 200 absorbs light introduced into the gap G to thereby minimize light introduced into the gap G and reflected to the outside. Accordingly, the revelation of a seam that may be formed by the gap G between the plurality of display modules 30A to 30P is reduced.

Taking the first display module 30A and the second display module 30E as an example, a first side surface member 200A of the first display module 30A and a second side surface member 200E of the second display module 30E may be disposed between a gap G formed between the first display module 30A and the second display module 30E together with the first region 101A of the first cover 100A and the first region 101E of the second cover 100E.

In the gap G, end portions 201A and 201E adjacent to each other among end portions of the first and second side surface members 200A and 200E may be disposed together with the side end portions 105A and 105E adjacent to each other among the side end portions of the first and second covers 100A and 100E of the first and second display modules 30A and 30E.

The adjacent side end portions 105A and 105E of the first and second covers 100A and 100E may be disposed to face each other, and the adjacent end portions 201A and 201E of the first and second side surface members 200A and 200E may be disposed to face each other.

The adjacent side end portions 105A and 105E of the first and second covers 100A and 100E may be disposed in parallel to each other, and the adjacent end portions 201A and 201E of the first and second side surface members 200A and 200E may be disposed in parallel to each other.

As described above, the side end portion 105 of the cover 100 and the end portion 201 of the side surface member 200 may be formed on the same line in the first direction X. Accordingly, when the first and second display modules 30A and 30E are arrayed, a gap that may be formed between the first and second display modules 30A and 30E may be minimized.

When a separation occurs between the first and second display modules 30A and 30E, an undesired seam may be perceived between the first and second display modules 30A and 30E. However, as the adjacent side end portions 105A and 105E of the first and second covers 100A and 100E are disposed in parallel to each other (e.g., in close contact with each other without a space therebetween), and the adjacent end portions 201A and 201E of the first and second side surface members 200A and 200E may be disposed in parallel to each other (e.g., in close contact with each other without a space therebetween), a seam is not perceived by a viewer.

That is, in the gap G formed between the first display module 30A and the second display module 30E, the first regions 101A and 101E of the first and second covers 100A and 100E may be arranged side by side in the second direction Y and the first and second side surface members 200A and 200E may be arranged side by side in the second direction Y.

The length of the first and second side surface members 200A and 200E each extending in the second direction Y is approximately equal to or less than half of the length of the gap G to correspond to the first regions 101A and 101E of the first and second covers 100A and 100E.

In the gap G between the first display module 30A and the second display module 30E, the first region 101A of the first cover 100A and the first region 101E of the second cover 100E are disposed, and the first and second side surface member 200A and 200E may be disposed behind the first regions 101A and 101E in the first direction X, respectively.

As described above, external light incident on the display panel 20 passes through the first regions 101A and 101E of the first and second covers 100A and 100E, by which the external light is diffusely reflected to the outside of the display panel 20 or partially absorbed so that the amount of light reaching the gap G is reduced.

Additionally, even when some light reaches the gap G, the light introduced into the gap G is absorbed by the first and second side surface members 200A and 200E disposed on the gap G, so that the revelation of the boundary between the first display module 30A and the second display module 30E may be reduced.

That is, at the same time as the amount of external light introduced into the gap G formed between the plurality of display modules 30A to 30P is reduced, light reaching the gap G is additionally absorbed, thereby improving the sense of unity of the screen of the display panel 20.

In addition, light might not be absorbed by the first and second side surface members 200A and 200E and may be reflected on the first and second side surface members 200A and 200E and directed to the outside of the display panel 20. However, the light, while passing through the first regions 101A and 101E of the display panel 20, may be diffusely reflected to the outside of the display panel 20, or partially absorbed by the first regions 101A and 101E, so that the amount transmitted to the outside of the display panel 20 is reduced, and thus the revelation of the boundary between the first display module 30A and the second display module 30E due to the gap G may be reduced.

As described above, the side surface member 200 is disposed in the gap G formed between the plurality of display modules 30A to 30P when the plurality of display modules 30A to 30P are arrayed, so that the side surface member 200 absorbs reaching the gap G and thus the revelation of the seam that may be perceived due to the gap G may be reduced.

In the above-described example, the cover 100 is provided to reduce the amount of light reaching the substrate 40 by diffusely reflecting, absorbing, circularly polarizing, or changing the reflection direction of a portion of the light introduced into the display panel 20.

However, an embodiment is not limited thereto, and the cover 100 may be formed of a transparent material through which light is transmitted without deformation. Even in this case, the revelation of the boundary between the plurality of display modules 30A to 30P due to the gap G may be reduced by the side surface member 200 disposed between the plurality of display modules 30A to 30P.

As described above, since the side surface member 200 is formed of a material that absorbs light, when at least a portion of the side surface member 200 is disposed in front of the cover 100 in the first direction X, a portion of light emitted from the plurality of inorganic LEDs 50 may be absorbed by the at least a portion of the side surface member 200. Accordingly, a part of a screen displayed on the display panel 20 is displayed dark.

However, the side surface member 200 according to an embodiment is disposed below the cover 100 in the first direction X, in detail, below the lower surface 106 of the first region 101, so that light emitted from the plurality of inorganic LEDs 50 is not absorbed, and the brightness of the image displayed on the display panel 20 may be uniform.

Referring to FIG. 8, the cover 100 may be provided to extend to an outside of the substrate 40 in the third direction Z. In detail, the cover 100 may be provided to extend to an area outside the side surface 45 and the chamfered portion 49 in the third direction Z.

The side end portion 105 of the cover 100 in the third direction Z may be disposed outside the edge 41e of the mounting surface 41 in the third direction Z or may be disposed in the gap G.

The first region 101 and the second region 102 of the cover 100 may be divided by the gap G in the third direction Z.

Taking the first display module 30A and the third display module 30B as an example, the first region 101A of the first cover 100A extending from the first display module 30A may be disposed in the gap G formed between the first display module 30A and the third display module 30B.

In the gap G, side end portions 105A and 105B adjacent to each other of side end portions of the first and third covers 100A and 100B of the first and third display modules 30A and 30B may be disposed.

In addition, the side surfaces 45 and the chamfered portions 49 of the first and third display modules 30A and 30B may be disposed in the gap G.

The first region 101B of the third cover 100B extending from the third display module 30B may be disposed in the gap G formed between the first display module 30A and the third display module 30B, and the second region 102B of the third cover 100B may be disposed on the mounting surface 41 of the third display module 30B.

That is, in the gap G formed between the first display module 30A and the third display module 30B, the first regions 101A and 101B of the first cover 100A and the third cover 100B are arranged side by side in the third direction Z.

External light directed to the display panel 20 is transmitted through the first regions 101A and 101B of the first and third covers 100A and 100B, by which the external light is diffusely reflected to the outside or is partially absorbed by the first regions 101A and 101B, so that the amount of light reaching the gap G is reduced and the revelation of the boundary between the first display module 30A and the third display module 30B due to the gap G may be reduced.

In addition, light reflected from the gap G and directed to the outside of the display panel 20 is transmitted through the first regions 101A and 101B of the first and third covers 100A and 100B, by which the light is diffusely reflected outside of the display panel 20 or partially absorbed by the first regions 101A and 101B so that the amount of light transmitted to the outside of the display panel 20 is reduced and the revelation of the boundary between the first display module 30A and the third display module 30B due to the gap G may be reduced.

As described above, the side surface member 200 may be disposed in a space formed on the side surface of the substrate 40 in the second direction Y and in a space formed on the side surface of the substrate 40 in the third direction Z.

On the side surface 45 of the substrate 40 that is arranged to face in the third direction Z, the side surface wiring 46 may be disposed. Accordingly, the side surface member 200 provided on the side surface 45 disposed to face in the third direction Z may be provided to cover the side surface 45, the chamfered portion 49, and the side surface wiring 46. Accordingly, the side surface wiring 46 is protected from external force, and is prevented from having foreign substances or moisture penetrated thereinto.

That is, the side surface member 200 may be provided to surround the lower surface 106 of the first region and the side surfaces 45 corresponding to the four edges 41e of the mounting surface 41 along the circumferences of the four edges 41e of the mounting surface 41 to thereby surround the side surface wiring 46 extending along the side surface 45 in the third direction Z.

Accordingly, the coupling between the cover 100 and the substrate 40 may be improved, and the cover 100, and the side surface 45 and the side surface wiring 46 of the substrate 40 may be protected from external forces.

The side end portion 105 of the cover 100 in the third direction Z and an end portion 201 of the side surface member 200 in the third direction Y are disposed on the same line in the first direction X. The side end portion 105 of the cover 100 and the end portion 201 of the side surface member 200 in a direction parallel to the first direction X may be disposed on the same line.

Taking the first display module 30A and the third display module 30B as an example, a first side surface member 200A of the first display module 30A and a third side surface member 200B of the third display module 30B may be disposed between a gap G formed between the first display module 30A and the third display module 30B together with the first region 101A of the first cover 100A and the first region 101B of the third cover 100B.

In the gap G, end portions 201A and 201B adjacent to each other among end portions of the first and third side surface members 200A and 200B may be disposed together with the side end portions 105A and 105B adjacent to each other among the side end portions of the first and third covers 100A and 100B of the first and third display modules 30A and 30B.

The adjacent side end portions 105A and 105B of the first and third covers 100A and 100B may be disposed to face each other, and the adjacent end portions 201A and 201B of the first and third side surface members 200A and 200B may be disposed to face each other.

As described above, the side end portion 105 of the cover 100 and the end portion 201 of the side surface member 200 may be formed on the same line in the first direction X. Accordingly, when the first and third display modules 30A and 30B are arrayed, a gap that may be formed between the first and third display modules 30A and 30B may be minimized.

In the gap G formed between the first display module 30A and the third display module 30B, the first regions 101A and 101B of the first and third covers 100A and 100B may be arranged side by side in the third direction Z and the first and third side surface members 200A and 200B may be arranged side by side in the third direction Z.

In the gap G between the first display module 30A and the third display module 30B, the first region 101A of the first cover 100A and the first region 101B of the third cover 100B are disposed, and the first and third side surface member 200A and 200B may be disposed behind the first regions 101A and 101B in the first direction X, respectively.

As described above, external light incident on the display panel 20 passes through the first regions 101A and 101B of the first and third covers 100A and 100B, by which the external light is diffusely reflected to the outside of the display panel 20 or partially absorbed so that the amount of light reaching the gap G is reduced.

Additionally, even when some light reaches the gap G, the light introduced into the gap G is absorbed by the first and third side surface members 200A and 200B disposed on the gap G, so that the revelation of the boundary between the first display module 30A and the third display module 30B may be reduced.

Light might not be absorbed by the first and third side members 200A and 200B and may be reflected on the first and third side members 200A and 200B and directed to the outside of the display panel 20. However, the light, while passing through the first regions 101A and 101B of the display panel 20, may be diffusely reflected to the outside of the display panel 20, or partially absorbed by the first regions 101A and 101B, so that the amount transmitted to the outside of the display panel 20 is reduced, and thus the revelation of the boundary between the first display module 30A and the third display module 30B due to the gap G may be reduced. Hereinafter, a method of manufacturing the display module 30A according to an embodiment will be briefly described.

Figure 9:
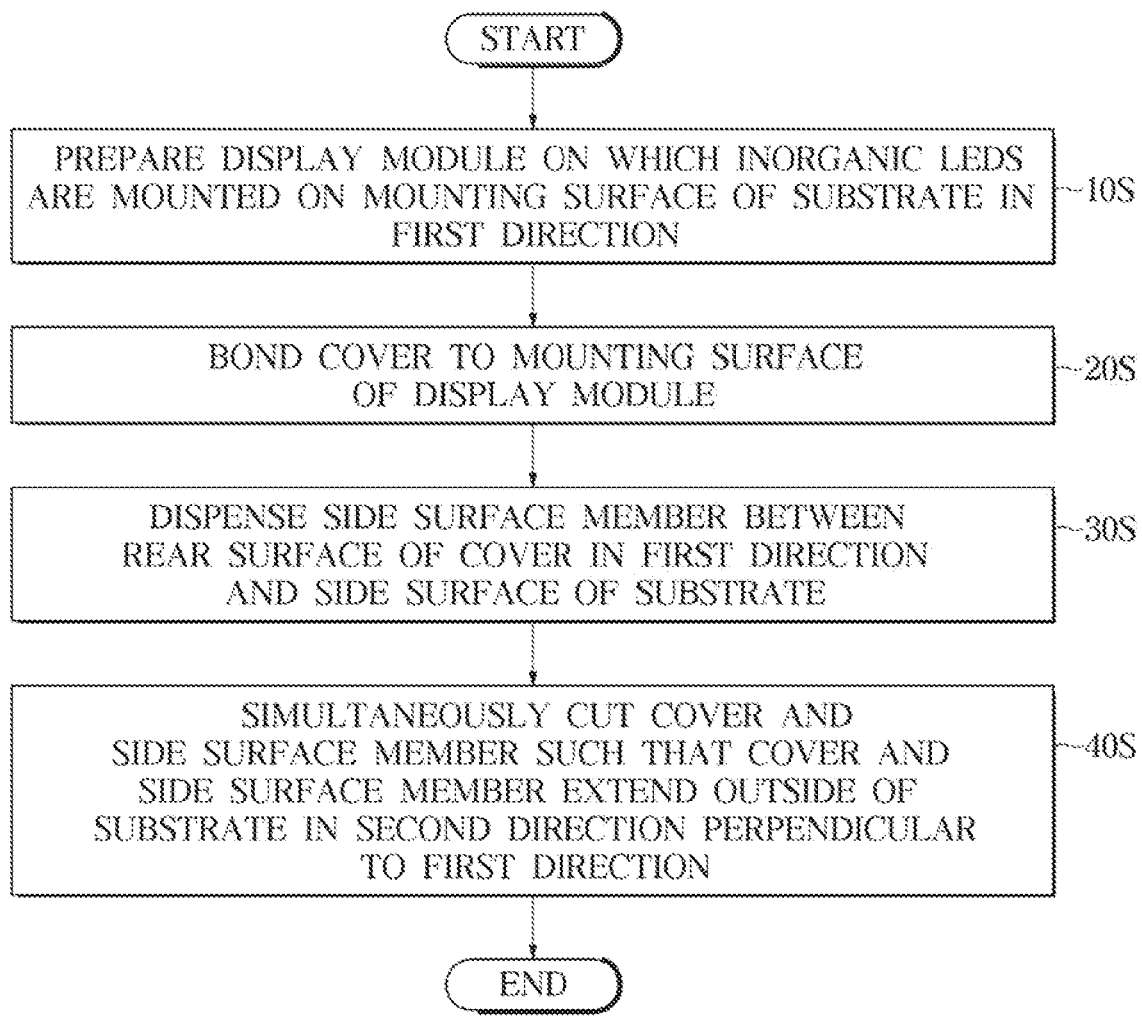
FIG. 9 is a flowchart showing a method of manufacturing a display apparatus according to an embodiment.
Figure 10:
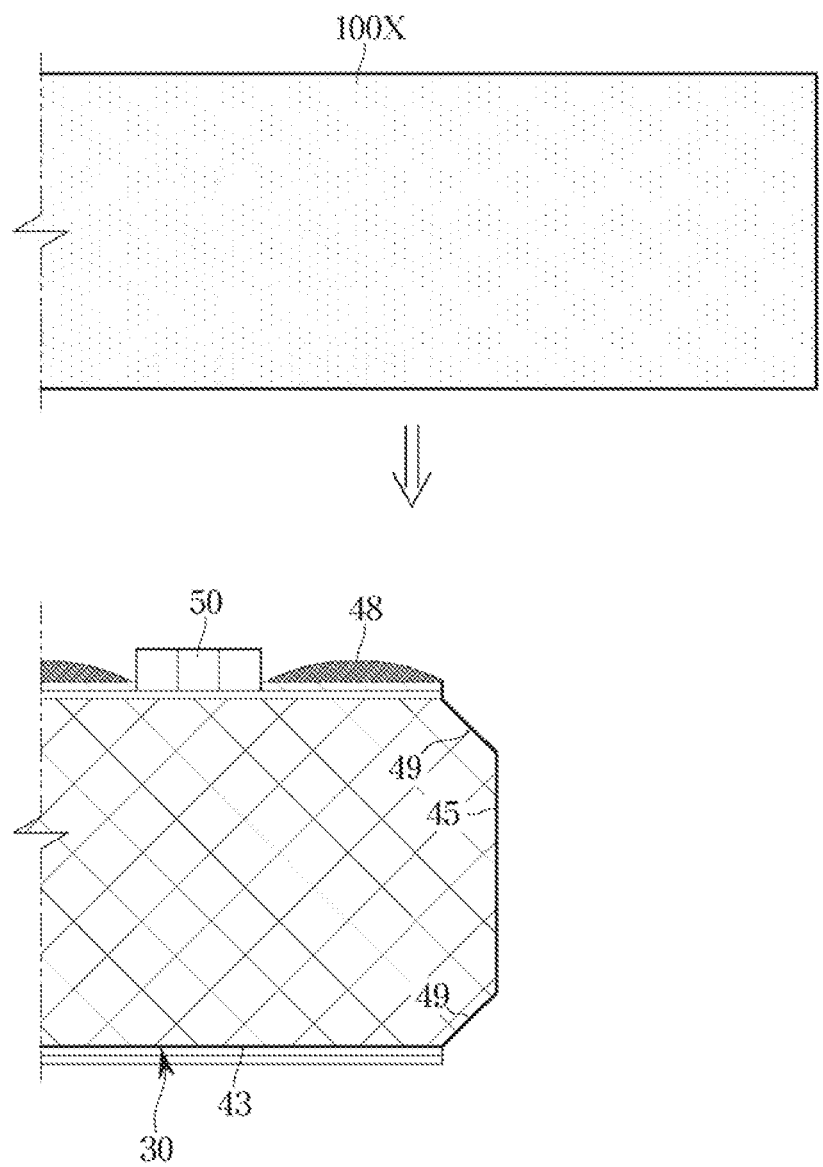
FIG. 10 is a view illustrating a process of manufacturing the display apparatus according to an embodiment.
Figure 11:
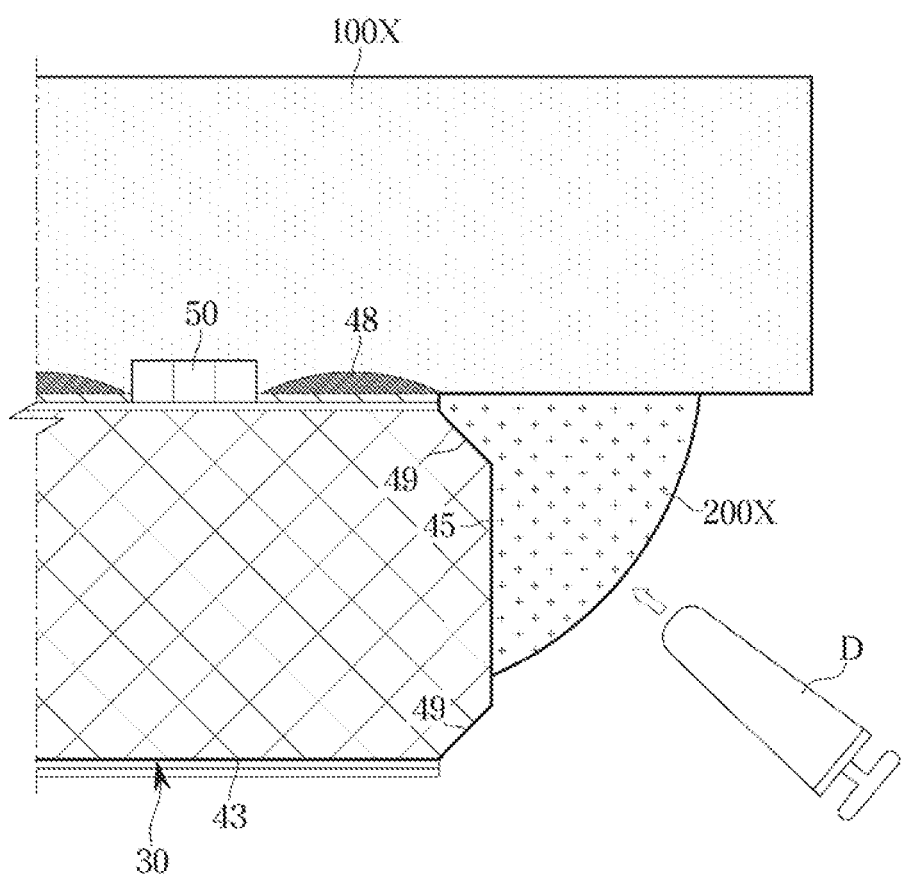
FIG. 11 is a view illustrating a process of manufacturing the display apparatus according to an embodiment, which follows the process shown in FIG. 9.
Figure 12:
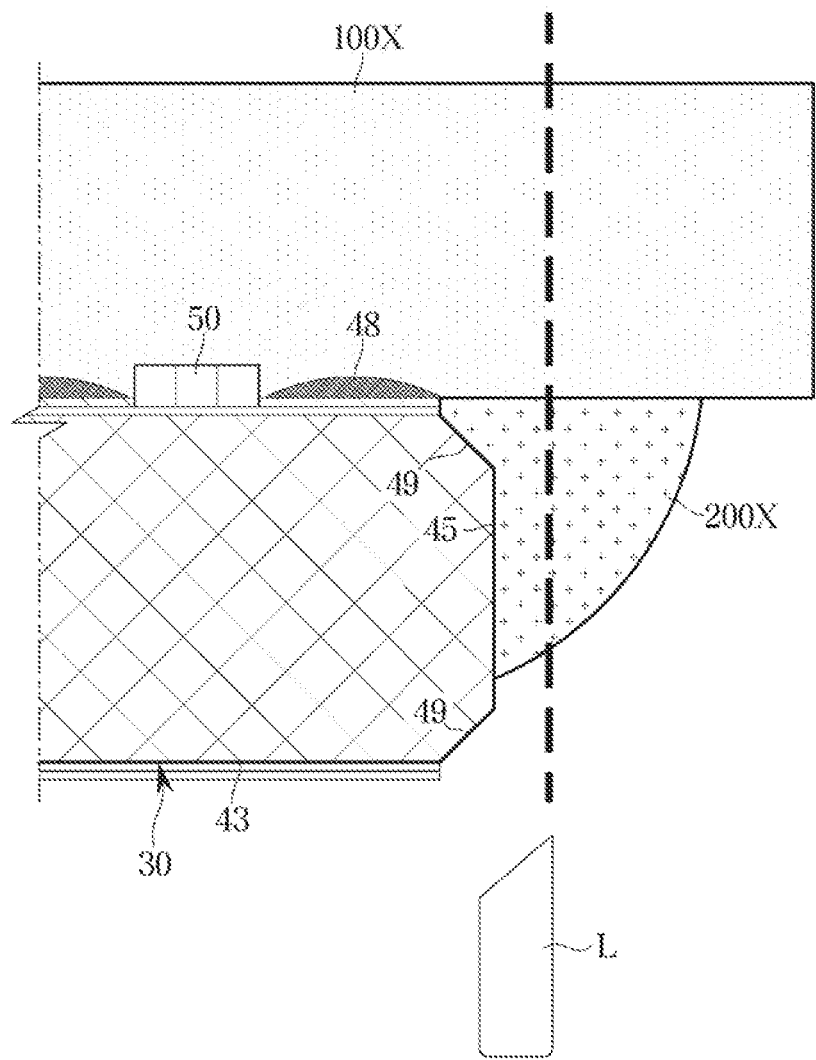
FIG. 12 is a view illustrating a process of manufacturing the display apparatus according to an embodiment, which follows the process shown in FIG. 10.

FIG. 9 is a flowchart showing a method of manufacturing a display apparatus according to an embodiment, FIG. 10 is a view illustrating a process of manufacturing the display apparatus according to an embodiment, FIG. 11 is a view illustrating a process of manufacturing the display apparatus according to an embodiment, following the process shown in FIG. 9, and FIG. 12 is a view illustrating a process of manufacturing the display apparatus according to an embodiment, following the process shown in FIG. 10.

First, a display module 30 is prepared (Operation 10S). A plurality of inorganic LEDs 50 are mounted on a mounting surface 41 of a substrate 40 of the display module 30. In order to improve the contrast, the substrate 40 may include a light absorbing layer 44c. The substrate 40 may include an anisotropic conductive layer 47 so as to easily connect the plurality of inorganic LEDs 50 to the substrate 40.

In addition, a black matrix 48 may be formed on the anisotropic conductive layers 47 of the plurality of display modules 30A to 30P.

Next, as shown in FIG. 10, a cover 100X is bonded to the mounting surface 41 of the display module 30 (Operation 20S). The cover 100X refers to a cover 100X before being cut. The cover 100X may cover the entire area of the substrate 40, including the mounting surface 41. The cover 100X may be formed through a compression hardening process on the mounting surface 41.

Next, as shown in FIG. 11, a side surface member 200X is dispensed in a space between a rear surface of the cover 100X in the first direction X and a side surface 45 of the substrate 40 and a chamfered portion 49 formed between the side surface 45 and the mounting surface 41 (Operation 30S).

Here, the side surface member 200X refers to a side surface member 200X before being cut together with the cover 100X.

The side surface member 200X may be applied in a predetermined dose by a dispenser D. The side surface member 200X may be cured through a subsequent operation. The side surface member 200X may be formed of, for example, a resin.

The side surface member 200X is provided to, while being cured, be bonded to the rear surface of the cover 100X in the first direction X and the side surface 45 of the substrate 40 and the chamfered portion 49 formed between the side surface 45 and the mounting surface 41.

When the side surface member 200X includes a photosensitive material, the side surface member 200X may be colored in a dark color by being irradiating with ultraviolet rays or the like as a subsequent operation. However, when the side surface member 200X is formed of a translucent or opaque material without including a photosensitive material, the irradiation of ultraviolet rays is not needed.

Next, as shown in FIG. 12, the cover 100X and the side surface member 200X are cut such that at least a portion of the cover 100X extends to an area outside the substrate 40 in the second direction Y perpendicular to the first direction X in which the mounting surface 41 faces (Operation 40S).

The cutting process may be performed by laser (L) cutting or the like. Accordingly, the cover 100X and the side surface member 200X may be simultaneously cut.

In the cutting process, in addition to the second direction Y, the cover 100X and the side surface member 200X may be cut such that the cover 100X includes the first region 101 in the third direction X perpendicular to the first direction X and the second direction Y and the side surface member 200X is disposed in the third direction Z as well as in the second direction Y.

Figure 13:
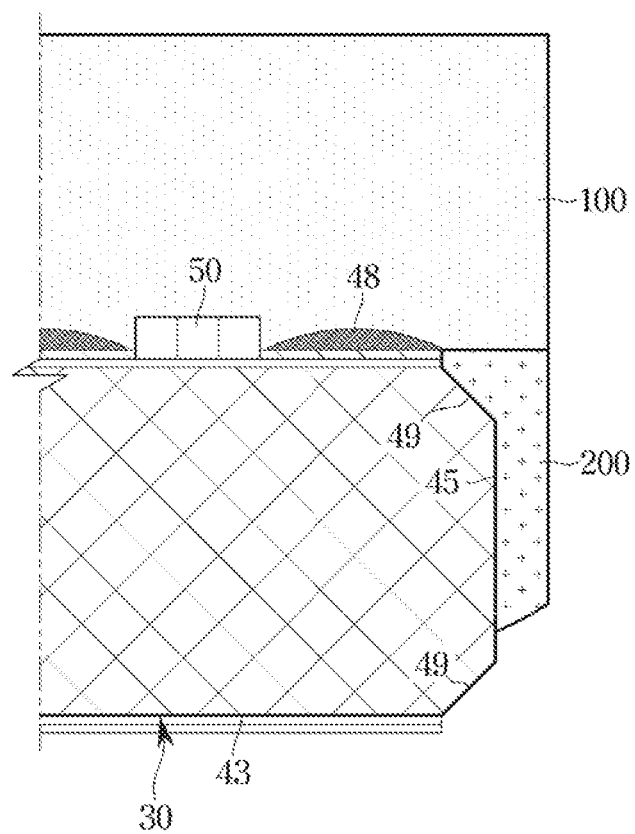
FIG. 13 is a view illustrating a process of manufacturing the display apparatus according to an embodiment, which follows the process shown in FIG. 11.

As shown in FIG. 13, a side end portion 105 of the cover 100 and an end portion 201 of the side surface member 200 may be formed on the same line in the first direction X by a cutting process. The side end portion 105 of the cover 100 and the end portion 201 of the side surface member 200 may be cut to be aligned in a direction parallel to the first direction X.

The first region 101 may be processed such that, when the display module 30 is provided in plural (display modules 30A to 30P) the length of the first region 101 extending outside the mounting surface 41 is equal to or less than half of the gap G formed between the plurality of display modules 30A to 30P.

Next, a process of bonding a metal plate 60 to the substrate 40 or connecting a driving circuit board (not shown) may be performed, but details thereof will be omitted.

The display module 30 processed as described above may be prepared as a plurality of display modules 30A to 30P, and the plurality of display modules 30A to 30P may be disposed to be adjacent to each other (Operation 40S). In this case, the plurality of display modules 30A to 30P may be fixed through a jig. The plurality of display modules 30A to 30P may be arranged in a matrix of M×N.

Accordingly, when the plurality of display modules 30A to 30P are disposed to be adjacent to each other, the first regions 101 of the cover 100 extending from each of the display modules 30A to 30P and the side surface members 200 disposed on the side surfaces 45 of the substrate 40 may be disposed in the gaps G formed between the plurality of display modules 30A to 30P.

Because the side end portion 105 of the cover 100 and the end portion 201 of the side surface member 200 are formed on the same line in the first direction X and are formed in line with a direction parallel to the first direction X, when the plurality of display modules 30A to 30P are arrayed, the spacing between the display modules 30A to 30P may be minimized.

Hereinafter, a display apparatus according to an embodiment will be described. Components other than a side surface member described below are the same as those of the display apparatus 1 according to the above-described embodiments, and thus descriptions thereof will be omitted.

Figure 14:
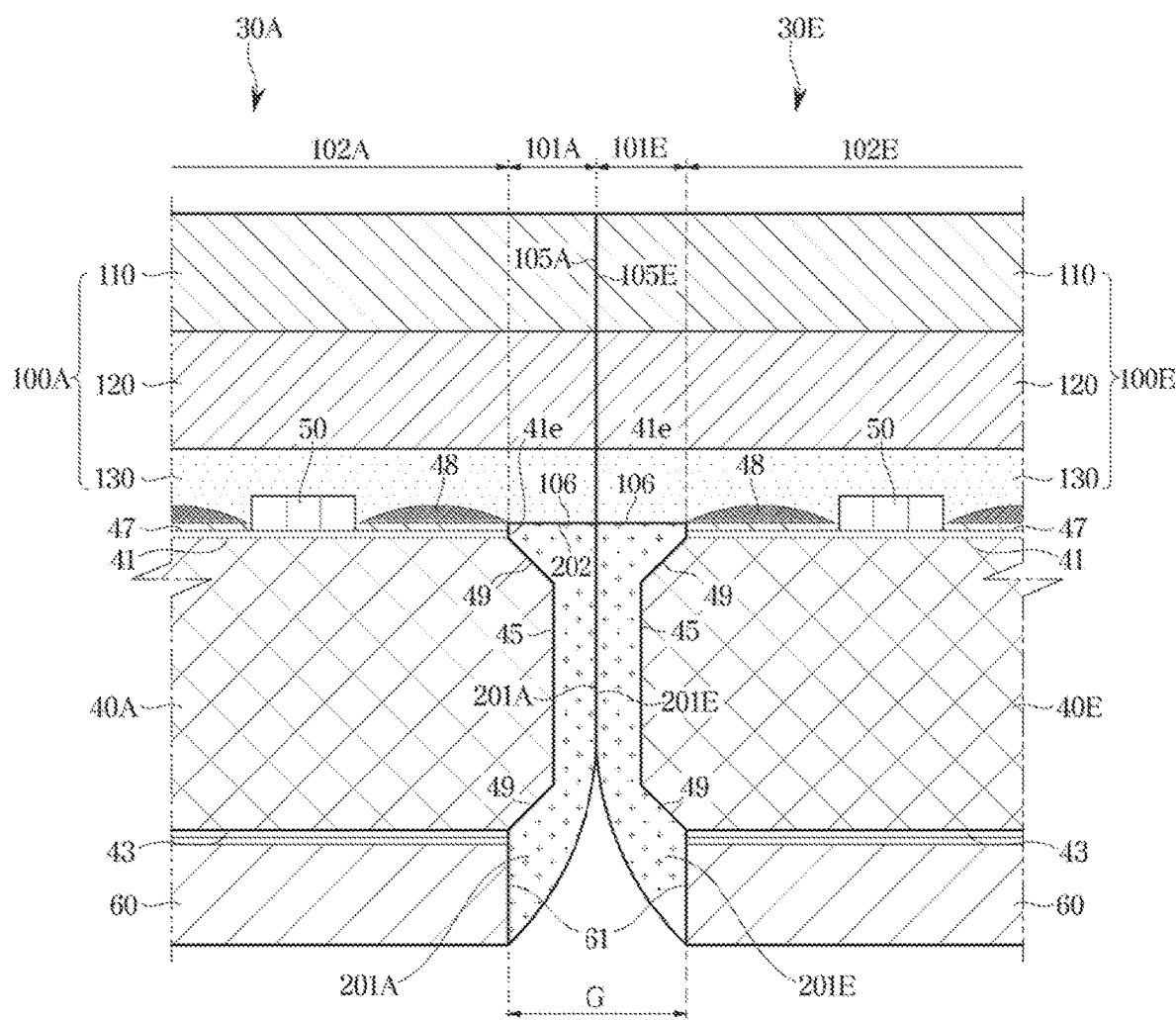
FIG. 14 is an enlarged cross-sectional view illustrating some components of a display apparatus according to an embodiment.

FIG. 14 is an enlarged cross-sectional view illustrating some components of a display apparatus according to an embodiment.

As described above, the side surface member 200 may be provided to cover the side surface 45 of the substrate 40 and the pair of chamfered portions 49 in the first direction X. Additionally, the side surface member 200 may be provided to extend to an area below the substrate 40 in the first direction X.

In detail, the side surface member 200 may be provided to cover up to a side end portion 61 of the metal plate 60 disposed on the rear surface 43 of the substrate 40.

The side surface member 200 may be provided to cover at least a portion of the side end portion 61 of the metal plate 60 in the first direction X. Accordingly, the side surface member 200 may be provided to surround all the edges of a portion where which the metal plate 60 is bonded to the rear surface 43.

Therefore, foreign substances or moisture is prevented from penetrating into a space that may be generated between the substrate 40 and the metal plate 60 from the outside, and because the entire area of the edge E of the substrate 40 is covered by the side surface member 200, the side surface member 200 may effectively protect the substrate 40 from external force.

Such a side surface member 200 may be formed by being dispensed in a larger amount during the manufacturing process of the display module than when manufacturing the side surface member 200 according to an embodiment.

In addition, before the dispensing of the side surface member 200 to the substrate 40 during the manufacturing process, a process of bonding the metal plate 60 to the substrate 40 may be performed. Accordingly, the side surface member 200 may easily cover even a side end portion 61 of the metal plate 60 during the manufacturing process.

According to an embodiment, display apparatus includes: a plurality of substrates two-dimensionally arranged, each of the plurality of substrates including a mounting surface on which a plurality of inorganic light emitting diodes (LEDs) are mounted and a side surface orthogonal to the mounting surface, wherein side surfaces of adjacent substrates are spaced apart by a gap and face each other across the gap, among the plurality of substrates; a plurality of covers provided in correspondence to the plurality of substrates, each of the plurality of covers including a first region extending into the gap and a second region covering the plurality of inorganic LEDs; and a plurality of side surface members provided in the gap, wherein each of adjacent side surface members of the plurality of side surface members is bonded to one of the side surfaces of the adjacent substrates, and is configured to be further bonded to a lower surface of one of adjacent first regions of adjacent covers among the plurality of covers. Each of the plurality of substrates with the plurality of inorganic LEDs mounted thereon, each of the plurality of covers, and each of the plurality of side surface members form one corresponding display module of a plurality of display modules adjacently disposed in the display apparatus.

Each of the plurality of substrates further includes a chamfered portion which is formed at a corner made by the mounting surface and the side surface, respectively, and faces the gap, and the plurality of side surface members are bonded to the chamfered portion, respectively.

The adjacent covers are stacked on the adjacent side surface members in a direction of an emission of light by the plurality of inorganic LEDs so that adjoining surfaces of the adjacent covers are aligned with adjoining surfaces of the adjacent side surface members, respectively.

According to an embodiment, the display apparatus absorbs light incident onto a gap between display modules adjacent to each other, thereby providing a seamless effect so that a seam is prevented from being visually perceived.

According to an embodiment, the display apparatus includes a plurality of display modules whose covers and substrates individually include components configured to absorb light incident onto or reflected from a gap between adjacent display modules, thereby easily and efficiently implementing the seamless effect when assembled.

According to an embodiment, the display apparatus may have the side surface member formed on the display module of the display apparatus so that a seamless effect can be provided and the cover and the substrate of the display module can be stably supported by the side surface member.

Although few embodiments have been shown and described, the above embodiment is illustrative purpose only, and it would be appreciated by those skilled in the art that changes and modifications may be made in these embodiments without departing from the principles and scope of the disclosure, the scope of which is defined in the claims and their equivalents.

The invention claimed is:

1. A display module comprising:
   a substrate comprising a mounting surface on which a plurality of inorganic light emitting diodes (LEDs) are mounted and a side surface orthogonal to the mounting surface;
   a cover which is disposed on the mounting surface, and comprising a first region extending to an area outside the mounting surface and a second region covering the mounting surface; and
   a side surface member provided on the side surface, wherein the side surface member is bonded to at least a portion of the side surface and configured to be further bonded directly to a lower surface of the first region of the cover that extends to the area outside the mounting surface.

2. The display module of claim 1, wherein the side surface member comprises a material that absorbs light.

3. The display module of claim 1, wherein the side surface member is further configured to support the lower surface of the first region of the cover that extends to the area outside the mounting surface and the at least the portion of the side surface.

4. The display module of claim 1, wherein one edge of the cover is extended to the area outside the mounting surface in an extending direction in which the mounting surface extends, and
   one edge of the side surface member in the extending direction and the one edge of the cover are arranged in line with each other in a direction in which the mounting surface faces that is orthogonal to the extending direction.

5. The display module of claim 1, wherein the substrate further comprises a chamfered portion formed between the mounting surface and the side surface, and
   the side surface member is provided to surround an entire area of the chamfered portion.

6. The display module of claim 1, wherein the side surface is provided to correspond to four edges of the mounting surface,
   the first region of the cover is provided to extend to the area outside the four edges of the mounting surface, and
   the side surface member surrounds the side surface and the lower surface of the first region of the cover that extends to the area outside the mounting surface along circumferences of the four edges of the mounting surface, respectively.

7. The display module of claim 1, wherein the cover comprises an adhesive layer forming the lower surface of the cover, and
   the side surface member covers a region of the adhesive layer that corresponds to the area outside the mounting surface.

8. The display module of claim 7, wherein the cover further comprises a layer arranged on the adhesive layer, the layer comprising a material configured to reduce light transmittance.

9. The display module of claim 1, wherein
   the side surface member is provided only at a position corresponding to the first region and extends in a direction in which the mounting surface faces.

10. The display module of claim 1, wherein the substrate further comprises:
    a rear surface opposite to the mounting surface;
    a first chamfered portion formed between the mounting surface and the side surface; and
    a second chamfered portion formed between the side surface and the rear surface, and
    wherein the side surface member is provided to surround the first chamfered portion and the second chamfered portion.

11. The display module of claim 10, further comprising a metal plate facing the rear surface of the substrate,
    wherein the side surface member is provided to extend from an edge of the mounting surface to an edge of the metal plate.

12. The display module of claim 2, wherein the side surface member comprises a photosensitive material.

13. The display module of claim 2, further comprising:
a driving circuit board configured to drive the plurality of inorganic LEDs and disposed at a side opposite to the mounting surface; and
a wiring which is configured to connect the plurality of inorganic LEDs to the driving circuit board and extends along the side surface,
wherein the side surface member is configured to cover at least a portion of the wiring on the side surface.

14. A display apparatus comprising:
a display module array comprising a plurality of display modules arranged in a matrix, each of the plurality of display modules comprising:
a substrate comprising a mounting surface on which a plurality of inorganic light emitting diodes (LEDs) are mounted and a side surface orthogonal to the mounting surface;
a cover which is disposed on the mounting surface, and comprising a first region extending to an area outside the mounting surface and a second region covering the mounting surface; and
a side surface member provided on the side surface, wherein the side surface member is bonded to at least a portion of the side surface and configured to be further bonded directly to a lower surface of the first region of the cover that extends to the area outside the mounting surface.

15. The display apparatus of claim 14, wherein the plurality of display modules comprise a first display module and a second display module arranged adjacent to the first display module, and
one end portion of the cover of the first display module that faces the second display module and the side surface member provided at a side surface of the first display module that is adjacent to the second display module are arranged in a gap formed between the mounting surface of the first display module and the mounting surface of the second display module.

16. The display apparatus of claim 15, wherein one end portion of the cover of the second display module that is adjacent to the one end portion of the first display module and the side surface member of the second display module that is adjacent to the side surface member of the first display module are arranged in the gap.

17. The display apparatus of claim 16, wherein a first side end portion of the side surface member of the first display module that faces the second display module and a second side end portion of the side surface member of the second display module that is adjacent to the first side end portion are arranged adjoining each other.

18. The display apparatus of claim 17, wherein the first side end portion and the second side end portion are disposed in parallel.

19. The display apparatus of claim 14, wherein the side surface member comprises a material that absorbs light.

20. The display apparatus of claim 14, wherein each of the plurality of display modules further comprises:
a driving circuit board provided to drive the plurality of inorganic LEDs and disposed at a side opposite to the mounting surface; and
a wiring which is configured to connect the plurality of inorganic LEDs to the driving circuit board and extends along the side surface, and
wherein the side surface member is configured to cover at least a portion of the wiring on the side surface.

21. A display apparatus comprising:
a plurality of substrates two-dimensionally arranged, each of the plurality of substrates comprising a mounting surface on which a plurality of inorganic light emitting diodes (LEDs) are mounted and a side surface orthogonal to the mounting surface, wherein side surfaces of adjacent substrates are spaced apart by a gap and face each other across the gap, among the plurality of substrates;
a plurality of covers provided in correspondence to the plurality of substrates, each of the plurality of covers comprising a first region extending into the gap and a second region covering the plurality of inorganic LEDs; and
a plurality of side surface members provided in the gap, wherein each of adjacent side surface members of the plurality of side surface members is bonded to one of the side surfaces of the adjacent substrates, and is configured to be further bonded to a lower surface of one of adjacent first regions of adjacent covers among the plurality of covers,
wherein each of the plurality of substrates with the plurality of inorganic LEDs mounted thereon, each of the plurality of covers, and each of the plurality of side surface members form one corresponding display module of a plurality of display modules adjacently disposed in the display apparatus.

22. The display apparatus of claim 21, wherein each of the plurality of substrates further comprises a chamfered portion which is formed at a corner made by the mounting surface and the side surface, respectively, and faces the gap, and
the plurality of side surface members are bonded to the chamfered portion, respectively.

23. The display apparatus of claim 21, wherein the adjacent covers are stacked on the adjacent side surface members in a direction of an emission of light by the plurality of inorganic LEDs so that adjoining surfaces of the adjacent covers are aligned with adjoining surfaces of the adjacent side surface members, respectively.

* * * * *